(12) United States Patent
Hata

(10) Patent No.: US 12,389,623 B2
(45) Date of Patent: Aug. 12, 2025

(54) NITRIDE SEMICONDUCTOR DEVICE

(71) Applicant: ROHM CO., LTD., Kyoto (JP)

(72) Inventor: Yosuke Hata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 514 days.

(21) Appl. No.: 17/858,168

(22) Filed: Jul. 6, 2022

(65) Prior Publication Data

US 2023/0009662 A1  Jan. 12, 2023

(30) Foreign Application Priority Data

Jul. 9, 2021 (JP) .................. 2021-114156

(51) Int. Cl.
H10D 30/47 (2025.01)
H10D 62/824 (2025.01)
H10D 62/85 (2025.01)

(52) U.S. Cl.
CPC ......... *H10D 30/475* (2025.01); *H10D 62/824* (2025.01); *H10D 62/8503* (2025.01)

(58) Field of Classification Search
CPC ....................... H01L 29/7786; H01L 29/2003; H01L 29/205
USPC ......................................................... 257/76
See application file for complete search history.

(56) References Cited

U.S. PATENT DOCUMENTS

| | | | |
|---|---|---|---|
| 2015/0295073 A1* | 10/2015 | Tomita | H01L 29/7781 |
| | | | 257/76 |
| 2018/0366559 A1* | 12/2018 | Cao | H01L 29/66462 |
| 2020/0111876 A1* | 4/2020 | Wang | H01L 29/66462 |
| 2022/0209001 A1* | 6/2022 | Otake | H01L 29/7786 |

FOREIGN PATENT DOCUMENTS

| | | |
|---|---|---|
| JP | 2015204304 A | 11/2015 |
| JP | 2016213389 A | 12/2016 |
| JP | 2017-73506 A | 4/2017 |
| JP | 2020523781 A | 8/2020 |

OTHER PUBLICATIONS

Notice of Reasons for Refusal issued Apr. 15, 2025 in corresponding Japanese patent application No. 2021-114156 (9 pages; with English machine translation).
Search Report by Registered Search Organization issued Mar. 28, 2025 in corresponding Japanese patent application No. 2021-114156 (33 pages; with English machine translation).

* cited by examiner

*Primary Examiner* — Christine S. Kim
*Assistant Examiner* — Andrew Victor Prostor
(74) *Attorney, Agent, or Firm* — XSENSUS LLP

(57) ABSTRACT

The present disclosure provides a nitride semiconductor device. The nitride semiconductor device includes: an electron transport layer, made of a nitride semiconductor; an electron supply layer, disposed on the electron transport layer and made of a nitride semiconductor having a band gap greater than a band gap of the nitride semiconductor of the electron transport layer; a first protective layer, disposed on the electron supply layer and made of a nitride semiconductor having a band gap less than the band gap of the nitride semiconductor of the electron supply layer; a second protective layer, disposed on a portion of the first protective layer and made of a nitride semiconductor having a band gap greater than the band gap of the nitride semiconductor of the first protective layer; and a gate layer, disposed on the second protective layer.

16 Claims, 13 Drawing Sheets

NITRIDE SEMICONDUCTOR DEVICE

CROSS-REFERENCE TO RELATED APPLICATION

The present application is based upon and claims the benefit of priority to Japanese Patent Application No. 2021-114156, filed on Jul. 9, 2021, the entire contents of which are herein incorporated by reference.

TECHNICAL FIELD

The present disclosure relates to a nitride semiconductor device.

BACKGROUND

Current products using high-electron-mobility transistors (HEMTs) of a nitride semiconductor are constantly evolving. When an HEMT is applied to a power device, based on the concern of fail safe, the implementation of a normally closed operation that cuts off a current path (channel) between the source and the drain at zero bias is required.

Patent publication 1 discloses a normally closed nitride semiconductor HEMT. The HEMT described in patent document 1 includes an electron transport layer made of a gallium nitride (GaN) layer, and an electron supply layer made of an aluminum gallium nitride (AlGaN) layer. The channel of the HEMT is formed by a two-dimensional electron gas (2DEG) generated in the electron transport layer near a heterojunction interface between the electron transport layer and the electron supply layer. The HEMT described in patent document 1 implements the normally closed operation by providing a GaN layer (p-type GaN layer) containing an acceptor-type impurity under a gate electrode and cutting off the channel formed by the 2DEG.

PRIOR ART DOCUMENT

Patent Publication

[Patent document 1] Japan Patent Publication No. 2017-73506

SUMMARY OF THE PRESENT DISCLOSURE

Problems to be Solved by the Present Disclosure

It is one task of a nitride semiconductor HEMT to inhibit current collapse. The so-called current collapse refers to the situation below. That is, when a high voltage is applied to a drain electrode (between a source and a drain) when the HEMT is turned off, electrons are trapped by crystal defects or surface energy levels of the nitride semiconductor layer, such that the generation of the 2DEG is hindered in the subsequent on state, causing a reduced drain current (an increased on resistance). The occurrence of current collapse degrades the reliability of the nitride semiconductor HEMT.

Technical Means for Solving the Problem

According to an embodiment of the disclosure, a nitride semiconductor device includes: an electron transport layer, made of a nitride semiconductor; an electron supply layer, disposed on the electron transport layer and made of a nitride semiconductor having a band gap greater than a band gap of the nitride semiconductor of the electron transport layer; a first protective layer, disposed on the electron supply layer and made of a nitride semiconductor having a band gap less than the band gap of the nitride semiconductor of the electron supply layer; a second protective layer, disposed on a portion of the first protective layer and made of a nitride semiconductor having a band gap greater than the band gap of the nitride semiconductor of the first protective layer; a gate layer, disposed on the second protective layer, made of a nitride semiconductor that has a band gap less than the band gap of the nitride semiconductor of the second protective layer, and containing an acceptor-type impurity; a gate electrode, disposed on the gate layer; and a source electrode and a drain electrode, connected with the electron supply layer.

Effects of the Present Disclosure

The nitride semiconductor device according to the present disclosure is capable of inhibiting current collapse.

DETAILED DESCRIPTION OF THE EMBODIMENTS

Figure 1:
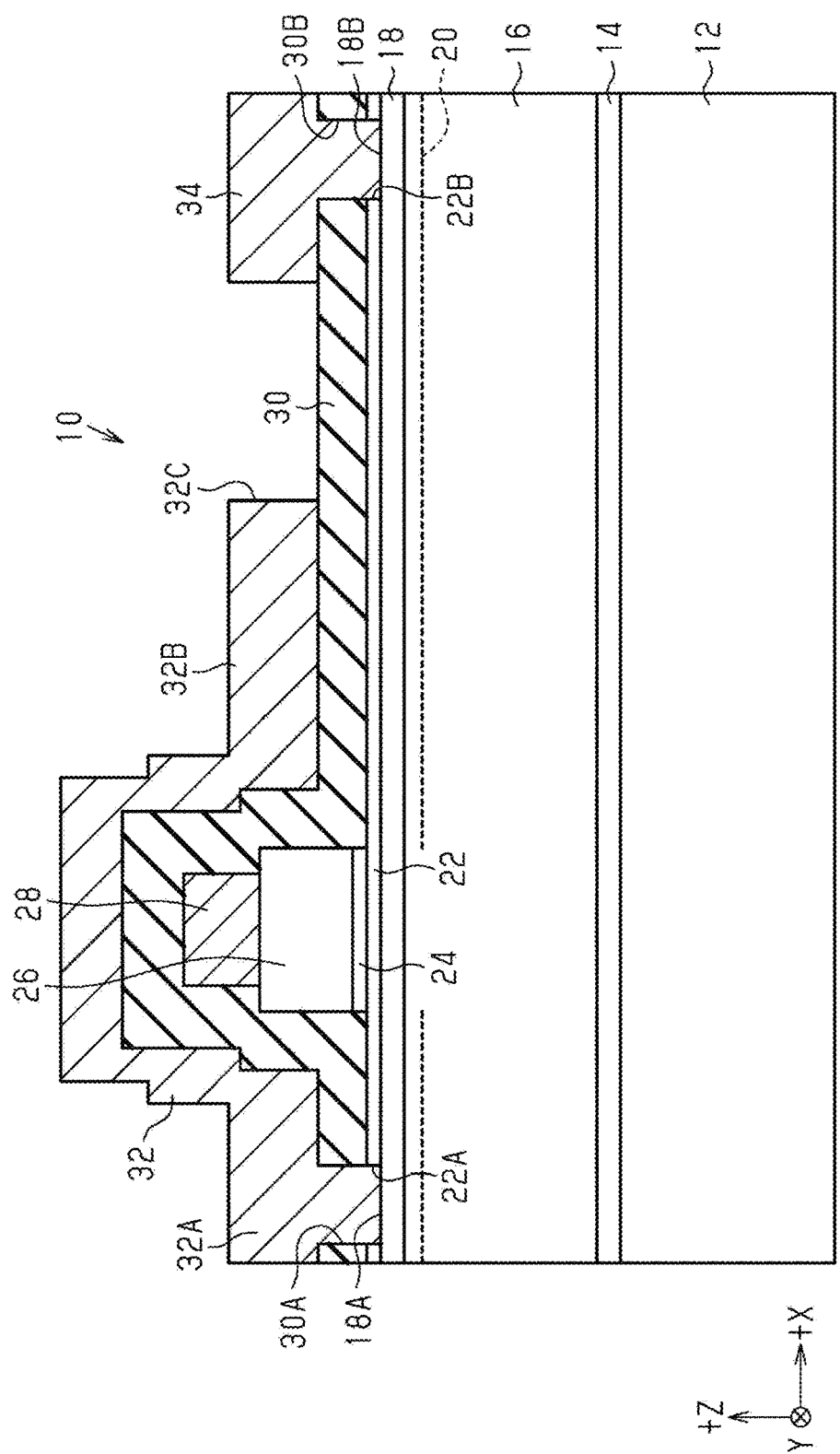
FIG. 1 is a brief section diagram of an exemplary nitride semiconductor device according to a first embodiment.

Details of several embodiments of a nitride semiconductor device of the present disclosure are given with the accompanying drawings below. The constituting elements shown in the drawings may be partially enlarged in some cases to achieve the object of easy understanding and clarity, and are not necessarily depicted according to actual scales. Moreover, for better understanding, shading lines may be omitted from the section diagrams. It should be noted that the drawings are for illustrating examples of the embodiments of the present disclosure, and are not to be construed as limitations to the present disclosure.

The description below includes details for substantively implementing a device, a system and a method of the embodiments of the present disclosure. The detailed description is intended for illustration purposes and is not to be construed as limitations to the embodiments of the present disclosure or applications and uses of these embodiments.

First Embodiment

FIG. 1 shows a brief section diagram of an exemplary nitride semiconductor device 10 according to a first embodiment. The nitride semiconductor device 10 is implemented by a nitride semiconductor HEMT. For example, the nitride semiconductor device can be implemented by a gallium nitride (GaN) HEMT.

In the first embodiment, the nitride semiconductor device 10 includes a substrate 12, a buffer layer 14 disposed on the substrate 12, an electron transport layer 16 disposed on the buffer layer 14, and an electron supply layer 18 disposed on the electron transport layer 16.

Moreover, unless otherwise specified, the term "top plan view" used in the present disclosure refers that the nitride semiconductor device 10 is observed in a Z direction where X, Y and Z axes (for example, refer to FIG. 1) are orthogonal to one another. In the present disclosure, the Z direction is a direction orthogonal to a face of the substrate 12 on which the electron transport layer 16 is disposed (interposed by the buffer layer 14 in the first embodiment). For better understanding of the description below, the +Z direction is sometimes referred to as up, the −Z direction is sometimes referred to as down, the +X direction is sometimes referred to as right, and the −X direction is referred to as left.

The substrate 12 can be, for example, made of silicon (Si), silicon carbide (SiC), GaN, sapphire, or other substrate materials. The thickness of the substrate 12 is set to, for example, 200 μm or more and 1500 μm or less.

The buffer layer 14 can be made of any material that can alleviate lattice mismatch between the substrate 12 and the electron transport layer 16. For example, the buffer layer 14 can include one or more nitride semiconductor layers. For example, the buffer layer 14 can include at least one of an aluminum nitride (AlN) layer, aluminum gallium nitride (AlGaN) layer, and a graded AlGaN layer with different aluminum (Al) compositions. For example, the buffer layer 14 can be formed by one single AlN layer, one single AlGaN layer, a layer having an AlGaN/GaN superlattice structure, a layer having an AlN/AlGaN superlattice structure, or a layer having an AlN/GaN superlattice structure.

In one embodiment, the buffer layer 14 can also be a multi-layer buffer layer including a first buffer layer and a second buffer layer, wherein the first buffer layer is an AlN layer disposed on the substrate 12, and the second buffer layer is a graded AlGaN layer disposed on the AlN layer. In this case, the thickness of the first buffer layer is set to, for example, 80 nm or more and 500 nm or less. The second buffer layer can include, for example, three AlGaN layers sequentially having Al compositions of 75%, 50% and 25%, starting from one side close to the first buffer layer. The thickness of the second buffer layer (the total thickness of the three AlGaN layers) can be set to, for example, 300 nm or more and 1 μm or less. The number of the graded AlGaN layers is not limited to three, and can be set to any other appropriate number of layers. Regarding the graded AlGaN layers, the thicknesses of the AlGaN layers can be the same or different. Moreover, to suppress a leakage current in the buffer layer 14, an impurity can be introduced to a part of the buffer layer 14 such that a region other than a surface-layer region of the buffer layer 14 is semi-insulative. In this case, the impurity is, for example, carbon (C) or iron (Fe), and can have a concentration set to $4\times10^{16}$ cm$^{-3}$ or more.

The electron transport layer 16 is made of a nitride semiconductor, and is, for example, a GaN layer. The thickness of the electron transport layer 16 is set to, for example, 0.5 μm or more and 2 μm or less. Moreover, to suppress a leakage current in the electron transport layer 16, an impurity can be introduced to a part of the electron transport layer 16 such that a region other than a surface-layer region of the electron transport layer 16 is semi-insulative. In this case, the impurity is, for example, C, and can have a concentration set to $4\times10^{16}$ cm$^{-3}$ or more.

The electron supply layer 18 is made of a nitride semiconductor having a band gap greater than a band gap of the nitride semiconductor of the electron transport layer 16, and is, for example, an AlGaN layer. The band gap gets larger as the Al composition increases, and so the electron supply layer 18 implemented by an AlGaN layer has a band gap greater than the band gap of the nitride semiconductor of the electron transport layer 16 implemented by a GaN layer. For example, the electron supply layer 18 is made of $Al_xGa_{1-x}N$, where x is, for example, $0<x<0.4$, and preferably $0.1<x<0.3$. The thickness of the electron support layer 18 can be set to, for example, 5 nm or more and 20 nm or less.

The electron transport layer 16 and the electron supply layer 18 are made of nitride semiconductors having different lattice constants from each other. Thus, a combination of the nitride semiconductor (for example, GaN) forming the electron transport layer 16 and the nitride semiconductor (for example, AlGaN) forming the electron supply layer 18 contains lattice mismatch. Due to spontaneous polarization of the electron transport layer 16 and the electron supply layer 18 and piezoelectric polarization caused by stress upon a heterojunction of the electron supply layer 18, a conduction band energy level of the electron transport layer 16 near a heterojunction interface between the electron transport layer 16 and the electron supply layer 18 is lower than a Fermi level. Thus, at a position near the heterojunction interface between the electron transport layer 16 and the electron supply layer 18 (for example, a position distanced from the interface by approximately several nm), a two-dimensional electron gas (2DEG) 20 is diffused in the electron transport layer 16.

The nitride semiconductor device 10 includes a first protective layer 22 disposed on the electron supply layer 18, a second protective layer 24 disposed on a portion of the first protective layer 22, a gate layer 26 disposed on the second protective layer 24, and gate electrode 28 disposed on the gate layer 26.

The nitride semiconductor device 10 further includes a passivation layer 30, a source electrode 32 and a drain electrode 34. The passivation layer 30 is disposed on the first protective layer 22, and covers the second protective layer 24, the gate layer 26 and the gate electrode 28. The source electrode 32 and the drain electrode 34 pass through the passivation layer 30 and are connected with the electron supply layer 18.

The passivation layer 30 includes a source-side through hole 30A and a drain-side through hole 30B. The first protective layer 22 includes a source-side opening 22A and a drain-side opening 22B. The source-side opening 22A communicates with the source-side through hole 30A, and exposes a portion of the electron supply layer 18 as a source contact 18A. The drain-side opening 22B communicates with the drain-side through hole 30B, and exposes a portion of the electron supply layer 18 as a drain contact 18B. The source electrode 32 is in ohmic contact with the source contact 18A via the source-side through hole 30A and the source-side opening 22A. The drain electrode 34 is in ohmic contact with the drain contact 18B via the drain-side through hole 30B and the drain-side opening 22B. Moreover, the source electrode 32 is electrically connected to the substrate 12, with such related drawing omitted.

The first protective layer 22 is provided to protect the electron supply layer 18. Moreover, the shape of the first protective layer 22 after the nitride semiconductor device 10 is manufactured is shown in FIG. 1. During the manufacturing process of the nitride semiconductor device 10, that is, when used as a protective layer for the electron supply layer 18, the first protective layer 22 has a shape different from that in FIG. 1.

The first protective layer 22 is made of a nitride semiconductor having a band gap less than the band gap of the nitride semiconductor of the electron supply layer 18. For example, when the electron supply layer 18 is an AlGaN layer, the first protective layer 22 can be a GaN layer. The first protective layer 22 is disposed almost on the entire electron supply layer 18. For example, the first protective layer 22 is disposed on an upper surface of the electron supply layer 18 excluding the source contact 18A and the drain contact 18B.

Moreover, in the example shown in FIG. 1, the first protective layer 22 is in contact with the source electrode 32 and the drain electrode 34, but can also be spaced from the source electrode 32 and the drain electrode 34. In other words, the first protective layer 22 can also be not in contact with the source electrode 32 and the drain electrode 34.

Further, the thickness of the first protective layer 22 is set to be less than the thickness of the gate layer 26. That is to say, the first protective layer 22 is thinner than the gate layer 26. Thus, a good normally closed operation can be maintained. The thickness of the gate layer 26 can be set to 100 nm or more and 140 nm or less, for example, 110 nm. The thickness of the first protective layer 22 can be set to 5 nm or more and 20 nm or less, for example, 15 nm or less.

The thickness of the first protective layer 22 is set in the consideration of the thickness of the electron supply layer 18, so as to prevent hindering of forming of the 2DEG 20 in the electron transport layer 16. That is to say, the thickness of the first protective layer 22 is set corresponding to the thickness of the electron supply layer 18 such that the concentration of the 2DEG 20 is maintained. For example, the thickness of the first protective layer 22 is set to be less than the thickness of the electron supply layer 18. The concentration of the 2DEG 20 can also be controlled by adjusting the Al composition of the electron supply layer 18.

The first protective layer 22 can also provide a function of hole diffusion. For example, if a larger positive bias is applied to the gate electrode 28, holes are injected from the gate electrode 28 into the gate layer 26. In this case, the holes are diffused in the first protective layer 22, accordingly reducing the density of holes at a junction interface between the first protective layer 22 and the electron supply layer 18. In other words, the first protective layer 22 inhibits partial hole accumulation that can possibly occur at the junction interface between the gate layer 26 and the electron supply layer 18 when the two are directly joined. Thus, band bending of the electron supply layer 18 implemented by an AlGaN layer as well as a gate leakage current accordingly generated can be suppressed, so as to increase a gate withstand voltage.

The first protective layer 22 can also contain, for example, at least one of magnesium (Mg) and zinc (Zn) as an acceptor-type impurity, as desired. For example, the first protective layer 22 can also be a p-type GaN layer. In the case where the first protective layer 22 contains an acceptor-type impurity, when a voltage in zero bias is not applied to the gate electrode 28, in a region directly below the gate electrode 28, the 2DEG 20 in the electron transport layer 16 can be eliminated, thereby enhancing the reliability of the normally closed operation.

The second protective layer 24 is provided to protect the electron supply layer 18 and the first protective layer 22. FIG. 1 shows the shape of the second protective layer 24 after the nitride semiconductor device 10 is manufactured. During the manufacturing process of the nitride semiconductor device 10, that is, when used as a protective layer for the electron supply layer 18 and the first protective layer 22, the second protective layer 24 has a shape different from that in FIG. 1.

The second protective layer 24 is made of a nitride semiconductor having a band gap greater than the band gap of the nitride semiconductor of the first protective layer 22. For example, when the first protective layer 22 is a GaN layer, the second protective layer 24 can be an AlGaN layer. In this case, the Al composition of the second protective layer 24 (an AlGaN layer) is set to be less than the Al composition of the electron supply layer 18 (an AlGaN layer). That is to say, the Al compositions of the electron supply layer 18 and the second protective layer 24 are set such that the second protective layer 24 has a band gap less than the band gap of the electron supply layer 18.

In one example, the electron supply layer 18 is formed by $Al_xGa_{1-x}N$ (for example, $0<x<0.4$, preferably $0.1<x<0.3$), and the second protective layer 24 is formed by $Al_yGa_{1-y}N$ (for example, $0<y<x$, preferably $0.05<y<x$). Moreover, the Al composition of the second protective layer 24 (an AlGaN layer) can also be determined by considering, for example, an etching selectivity ratio (an etching selectivity ratio of a layer forming the gate layer 26 relative to forming the second protective layer 26) when the gate layer 26 is formed by etching.

In a region directly below the gate layer 26, the second protective layer 24 is disposed on the first protective layer 22. In the first embodiment, an area of the second protective layer 24 is same as an area of a bottom surface of the gate layer 26 in a top plan view. Thus, the second protective layer 24 has a same width as the width of the gate layer 26. Moreover, unless otherwise specified, the term "width" used in the present disclosure is defined as a length along the X axis in FIG. 1.

The thickness of the second protective layer 24 is set to be less than the thickness of the electron supply layer 18. That is to say, the second protective layer 24 is thinner than the electron supply layer 18. For example, the thickness of the second protective layer 24 can be set to 2 nm or more. In addition, when the thickness of the electron supply layer 18 is, for example, 20 nm or less, and the thickness of the second protective layer 24 can be set to, for example, 10 nm or less. Alternatively, when the thickness of the electron supply layer 18 is, for example, 15 nm or less, and the thickness of the second protective layer 24 can be set to, for example, 7 nm or less. As such, the thickness of the second protective layer 24 is set to be ½ or less of the thickness of the electron supply layer 18.

Moreover, the relation between the thickness of the first protective layer 22 and the thickness of the second protective layer 24 is not specifically defined; for example, the second protective layer 24 can also have a same thickness as the thickness of the first protective layer 22. Alternatively, the second protective layer 24 can also have a thickness more than the thickness of the first protective layer 22, or can have a thickness less than the thickness of the first protective layer 22.

The second protective layer 24 can also contain, for example, at least one of Mg and Zn as an acceptor-type impurity, as desired. For example, the second protective layer 24 can also be a p-type GaN layer. When the second protective layer 24 contains an acceptor-type impurity, during zero bias, in a region directly below the gate electrode 28, the 2DEG 20 in the electron transport layer 16 can be eliminated, thereby enhancing the reliability of the normally closed operation.

The gate layer 26 is made of a nitride semiconductor that has a band gap less than the band gap of the nitride semiconductor of the second protective layer 24, and contains an acceptor-type impurity. For example, when the second protective layer 24 is an AlGaN layer, the gate layer 26 can be a GaN layer (p-type GaN layer) doped with an acceptor-type impurity. In this embodiment, the gate layer 26 is disposed over the entire second protective layer 24. Moreover, the shape of the gate layer 26 is not specifically defined. For example, in FIG. 1, the gate layer 26 has a rectangular cross section, but can also have a trapezoidal cross section or a ridged cross section. The thickness and the width of the gate layer 26 can be determined in the consideration of a maximum forward rated voltage of the gate, that is, the withstand voltage of the gate. The thickness of the gate layer 26 can be set to 100 nm or more and 140 nm or less, for example, 110 nm. The width (for example, a bottom width) of the gate layer 26 can be set to 0.4 μm or more and 1.0 μm or less, for example, 0.5

The acceptor-type impurity doped in the gate layer 26 can also include at least one of Mg, Zn and C, and is Mg in the first embodiment. In this case, the average concentration of Mg in the gate layer 26 can be set to, for example, $1 \times 10^{19}$ $cm^{-3}$ or more and $3 \times 10^{19}$ $cm^{-3}$ or less, and is preferably set to $2 \times 10^{19}$ $cm^{-3}$. Moreover, the average doping concentration of the acceptor-type impurity in the gate layer 26 is set to be higher than the average doping concentrations of the acceptor-type impurities (when including acceptor-type impurities) in the first and second protective layers 22 and 24. During zero bias of the gate layer 26, in a region direction below the gate layer 26, the 2DEG 20 formed in the electron transport layer 16 is depleted.

The gate electrode 28 is disposed, for example, on a portion of an upper surface of the gate layer 26. The gate electrode 28 and the gate layer 26 form a Schottky junction. The gate electrode 28 is made of one or more metal layers, which are, for example, a titanium nitride (TiN) layer. Alternatively, the gate electrode 28 can also be made of a first metal layer and a second metal layer, wherein the first metal layer is formed of Ti, and the second metal layer is disposed on the first metal layer and is formed of TiN. The thickness of the gate electrode 28 can be set to, for example, 50 nm or more and 300 nm or less.

The passivation layer 30 covers the first protective layer 22, the second protective layer 24, the gate layer 26 and the gate electrode 28. The passivation layer 30 can be set to be a layer formed using any one of SiN, silicon dioxide ($SiO_2$), silicon oxynitride (SiON), aluminum oxide ($Al_2O_3$), AlN and aluminum oxynitride (AlON), or a composite layer formed of two or more of the above. For example, the passivation layer 30 is a SiN layer. In the first embodiment, the passivation layer 30 covers an upper surface of the first protective layer 22, a side surface of the second protective layer 24, a side surface and an upper surface of the gate layer 26, and a side surface and an upper surface of the gate electrode 28.

The source electrode 32 and the drain electrode 34 are made of one or more metal layers. The source electrode 32 includes a source electrode portion 32A, and a source field plate portion 32B continuous with the source electrode portion 32A.

The source electrode portion 32A includes a filling region filled in the source-side through hole 30A, and an upper region as a formed integral with the filling region and located in a peripheral region of the source-side through hole 30A and a region above the gate electrode 28 in a top plan view. The source field plate portion 32B is a formed integral with the upper region of the source electrode portion 32A, and has an end portion 32C near the drain electrode 34. The length of the source field plate portion 32B from an end portion of the gate layer 26 to the end portion 32C in a direction along the X axis in FIG. 1 is defined as a source field plate length. The source field plate 32B functions as below; that is, when a high voltage is applied to a source-drain voltage Vds while a gate-source voltage Vgs=0 V (the transistor is off), a depletion layer is caused to extend to a region directly below the source field plate portion 32B. Thus, electric field concentration near the end portion of the gate electrode 28 can be alleviated, thereby inhibiting the occurrence of current collapse.

Figure 2:
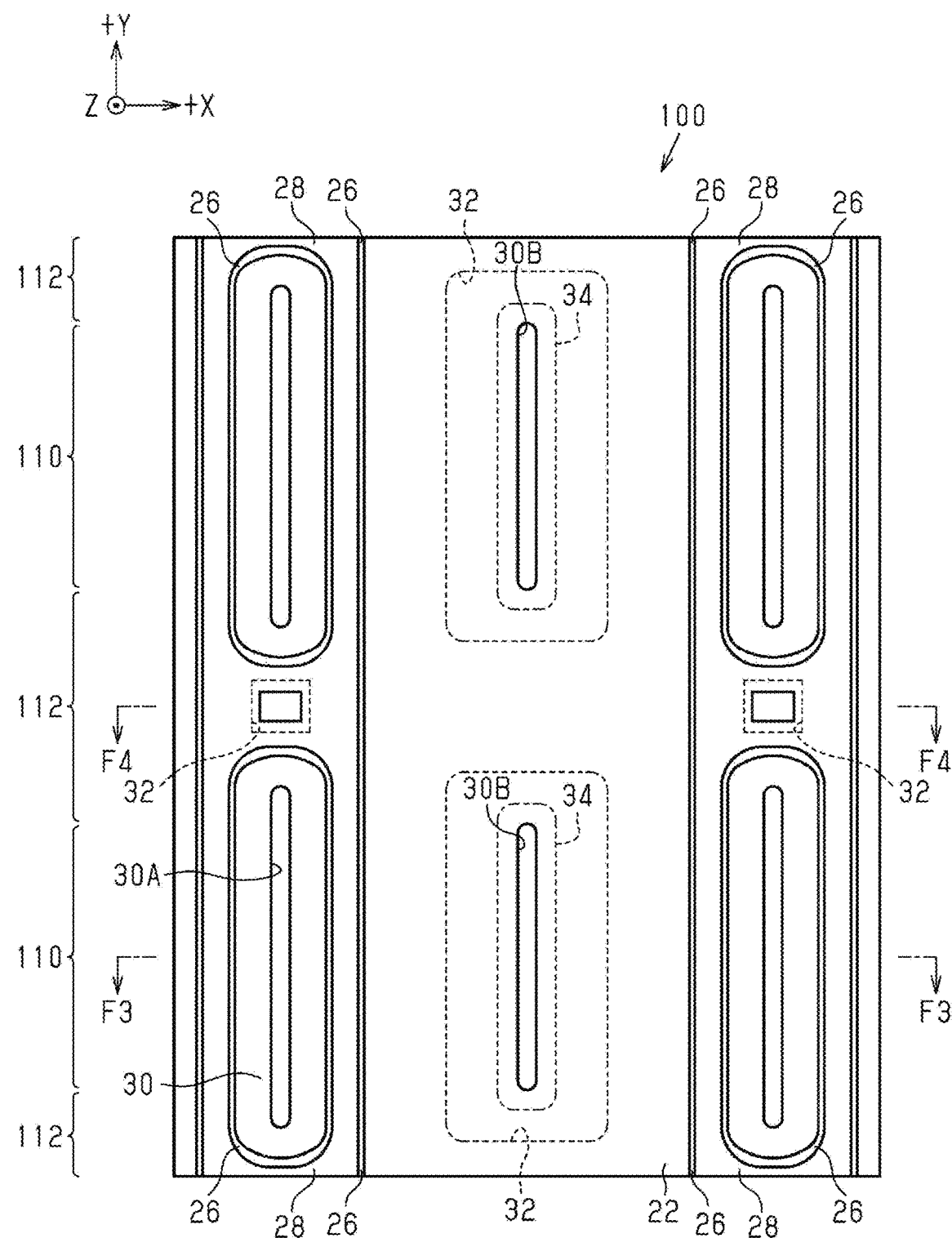
FIG. 2 is a brief top plan view of an exemplary pattern formed in the nitride semiconductor device in FIG. 1.
Figure 3:
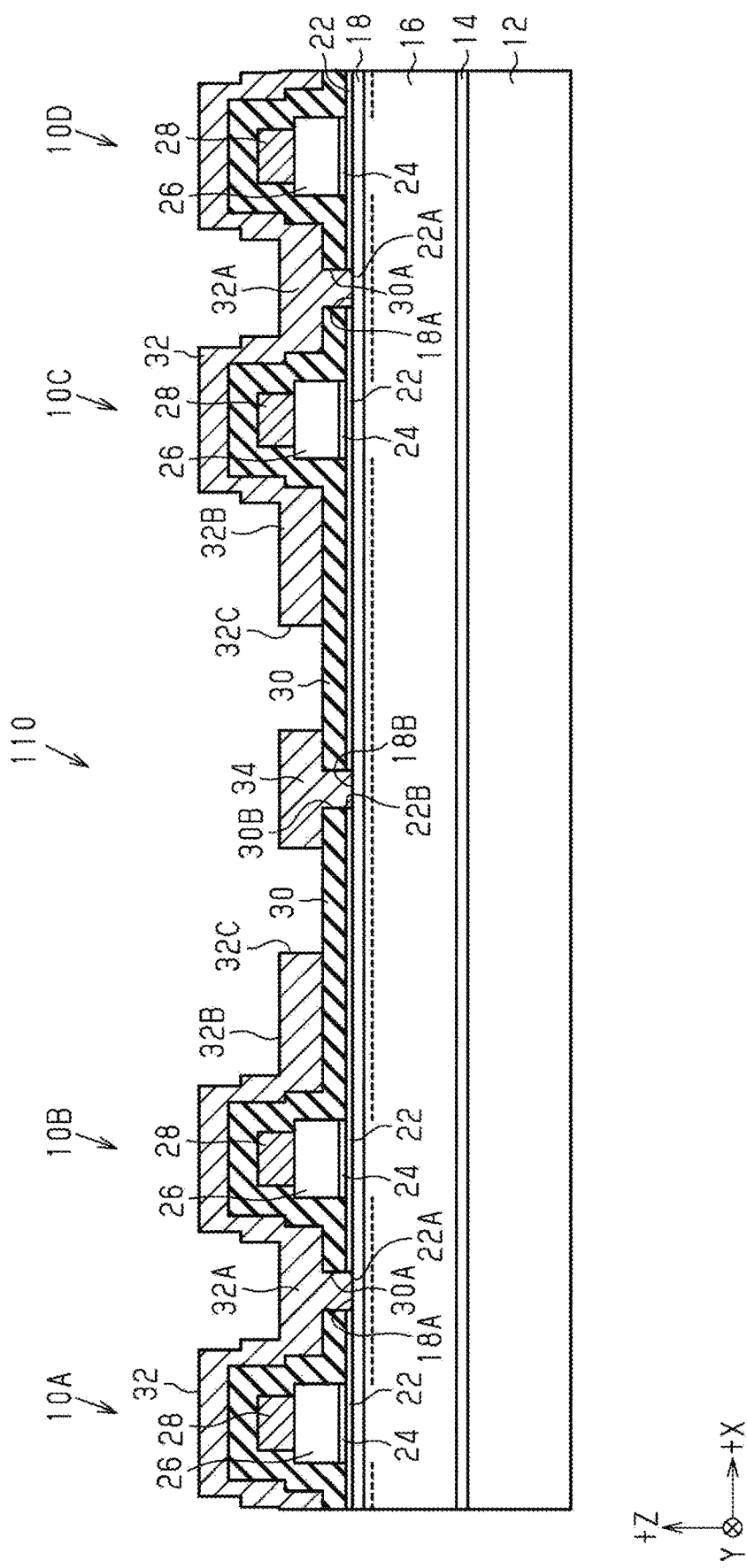
FIG. 3 is a brief section diagram of an active area along the line F3-F3 in FIG. 2.
Figure 4:
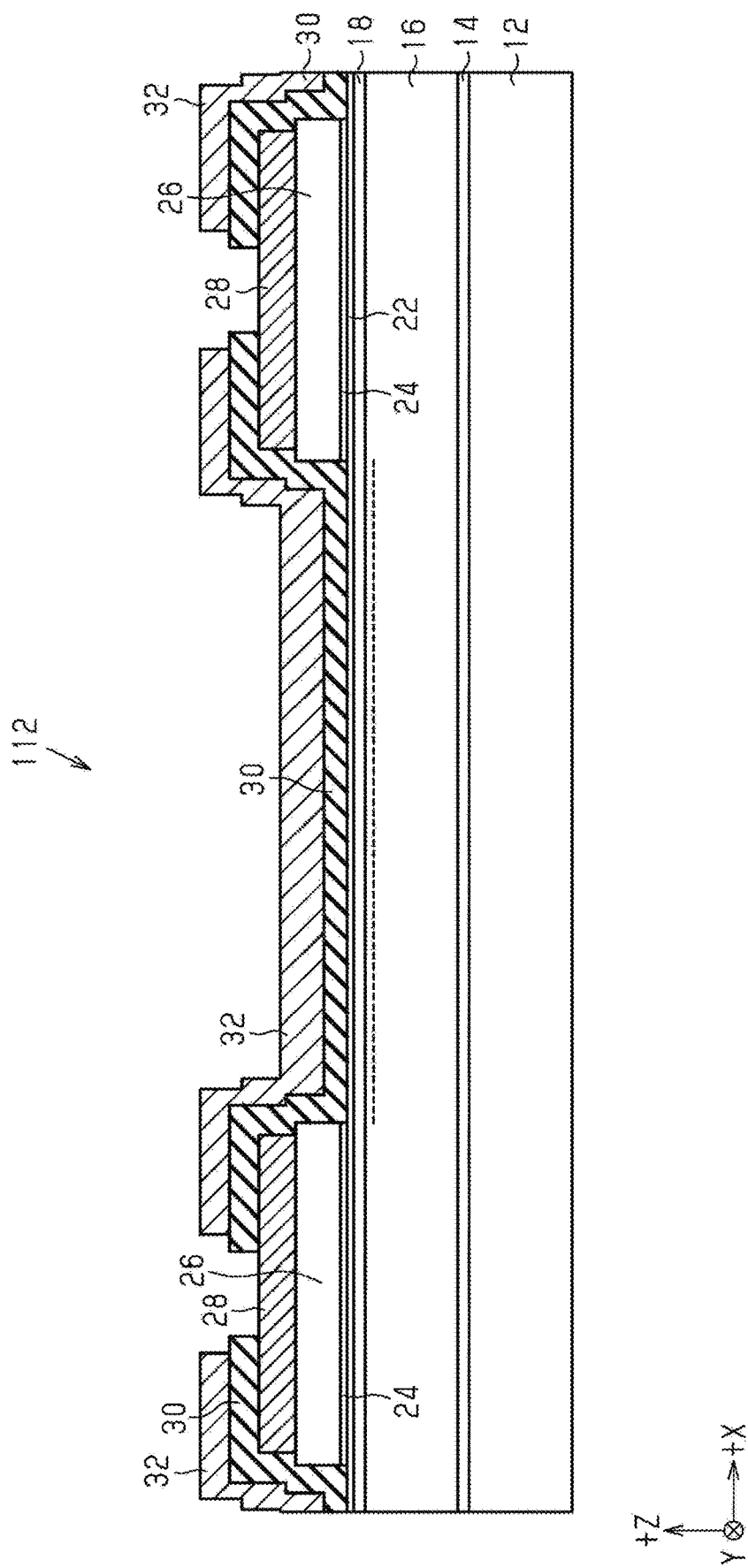
FIG. 4 is a brief section diagram of a non-active area along the line F4-F4 in FIG. 2.

FIG. 2 shows a brief top plan view of an exemplary pattern 100 formed in the nitride semiconductor device 10 in FIG. 1. FIG. 3 shows a brief section diagram of an active area 110 along the line F3-F3 in FIG. 2, and FIG. 4 shows a brief section diagram of a non-active area along the line F4-F4 in FIG. 2. Moreover, for better understanding, in FIG. 2 to FIG. 4, the constituting elements that is the same as the constituting elements in FIG. 1 are denoted by the same numerals or symbols. In addition, to avoid complications of the drawings, the source electrode 32 and the drain electrode 34 are depicted in dotted lines.

As shown in FIG. 2, the pattern 100 formed includes the active area 110 that contributes to transistor operations, and the non-active area 112 that does not contribute to transistor operations. The active area 110 refers to a region in which a current flows between the source and the drain when a voltage is applied to the gate electrode 28.

As shown in FIG. 3, in the active area 110, multiple (four in the example in FIG. 3) nitride semiconductor devices (nitride semiconductor HEMTs) 10A to 10D are continuously formed in the X axis direction. Each of the nitride semiconductor devices 10A to 10D is identically structured as the nitride semiconductor device 10 in FIG. 1. In the active area 110, the first protective layer 22 is disposed on an upper surface of the electron supply layer 18 excluding the source contact 18A and the drain contact 18B. In a region directly below the gate layer 26 of each of the nitride semiconductor devices 10A to 10D, the second protective layer 24 is disposed on the first protective layer 22.

As shown in FIG. 4, the drain electrode 34 is not formed in the non-active area 112. The passivation layer 30 and the source electrode 32 are continuously formed along the X-axis direction. In addition, in the non-active area 112, the first protective layer 22 is also disposed on the entire upper surface of the electron supply layer 18. In a region directly below the gate layer 26, the second protective layer 24 is disposed on the first protective layer 22.

As shown in FIG. 2, the first protective layer 22, the gate layer 26, the gate electrode 28 and the source electrode 32 are continuously formed between the active area 110 and the non-active area 112 along the Y-axis direction. Moreover, the second protective layer 24 is also continuously formed in the active area 110 and the non-active area 112, with associated details omitted from the drawings.

Next, a manufacturing method for the nitride semiconductor device 10 in FIG. 1 is described below. FIG. 5 to FIG. 11 show brief section diagrams of exemplary manufacturing steps for the nitride semiconductor device 10. In FIG. 5 to FIG. 11, for better understanding, for final constituting elements or corresponding constituting elements included in the nitride semiconductor device 10, the reference numerals or symbols in FIG. 1 are partially marked with parentheses in these drawings.

Figure 5:
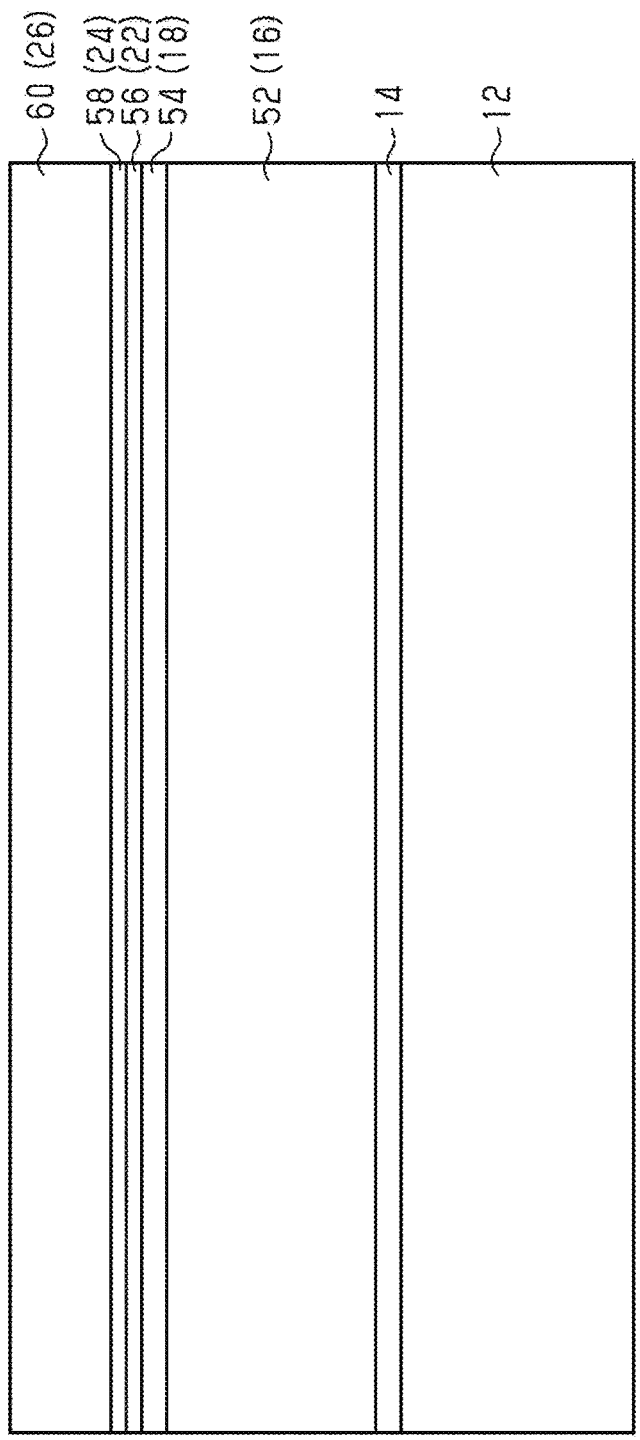
FIG. 5 is a brief section diagram of an exemplary manufacturing step for the nitride semiconductor device in FIG. 1.

As shown in FIG. 5, the manufacturing method for the nitride semiconductor device 10 includes a step of forming a first nitride semiconductor layer 52, wherein the first nitride semiconductor layer 52 forms the electron transport layer 16. The manufacturing method further includes a step of forming a second nitride semiconductor layer 54 on the first nitride semiconductor layer 52, wherein the second nitride semiconductor layer 54 has a band gap greater than a band gap of the first nitride semiconductor layer 52 and forms the electron supply layer 18.

The manufacturing method for the nitride semiconductor device 10 further includes a step of forming a third nitride semiconductor layer 56 on the second nitride semiconductor layer 54, wherein the third nitride semiconductor layer 56 has a bandgap less than the band gap of the second nitride semiconductor layer 54. The third nitride semiconductor layer 56 is used to form the first protective layer 22.

The manufacturing method for the nitride semiconductor device 10 further includes a step of forming a fourth nitride semiconductor layer 58 on the third nitride semiconductor layer 56, wherein the fourth nitride semiconductor layer 58 has a band gap greater than the band gap of the third nitride semiconductor layer 56. The fourth nitride semiconductor layer 58 is used to form the second protective layer 24.

The manufacturing method for the nitride semiconductor device 10 further includes a step of forming a fifth nitride semiconductor layer 60 on the fourth nitride semiconductor layer 58, wherein the fifth nitride semiconductor layer 60 has a bandgap less than the band gap of the fourth nitride semiconductor layer 58, and contains an acceptor-type impurity. The fifth nitride semiconductor layer 60 is used to form the gate layer 26.

In one example, as shown in FIG. 5, on the substrate 12 implemented by a Si substrate, the buffer layer 14, the first nitride semiconductor layer 52, the second nitride semiconductor layer 54, the third nitride semiconductor layer 56, the fourth nitride semiconductor layer 58 and the fifth nitride semiconductor layer 60 are sequentially formed by means of epitaxial growth. The epitaxial growth process can be implemented by, for example, metal organic chemical vapor deposition (MOCVD).

The buffer layer 14 is, for example, a multi-layer buffer layer; that is, an AlN layer (a first buffer layer) is formed on the substrate 12, and then a graded AlGaN layer (a second buffer layer) is formed on the AlN layer. However, associated details are omitted from the drawings. The graded AlGaN layer is formed by sequentially depositing three AlGaN layers respectively having Al compositions of 75%, 50% and 25%, starting from one side close to the AlN layer.

In the first embodiment, a GaN layer as the first nitride semiconductor layer 52 is formed on the buffer layer 14, and an AlGaN layer as the second nitride semiconductor layer 54 is formed on the first nitride semiconductor layer 52. The first nitride semiconductor layer 52 corresponds to the electron transport layer 16 in FIG. 1, and the second nitride semiconductor layer 54 corresponds to the electron supply layer 18 in FIG. 1.

Next, a GaN layer as the third nitride semiconductor layer 56 is formed on the second nitride semiconductor layer 54, and an AlGaN layer as the fourth nitride semiconductor layer 58 is formed on the third nitride semiconductor layer 56. Next, a p-type GaN layer as the fifth nitride semiconductor layer 60 is formed on the fourth nitride semiconductor layer 58.

Figure 6:
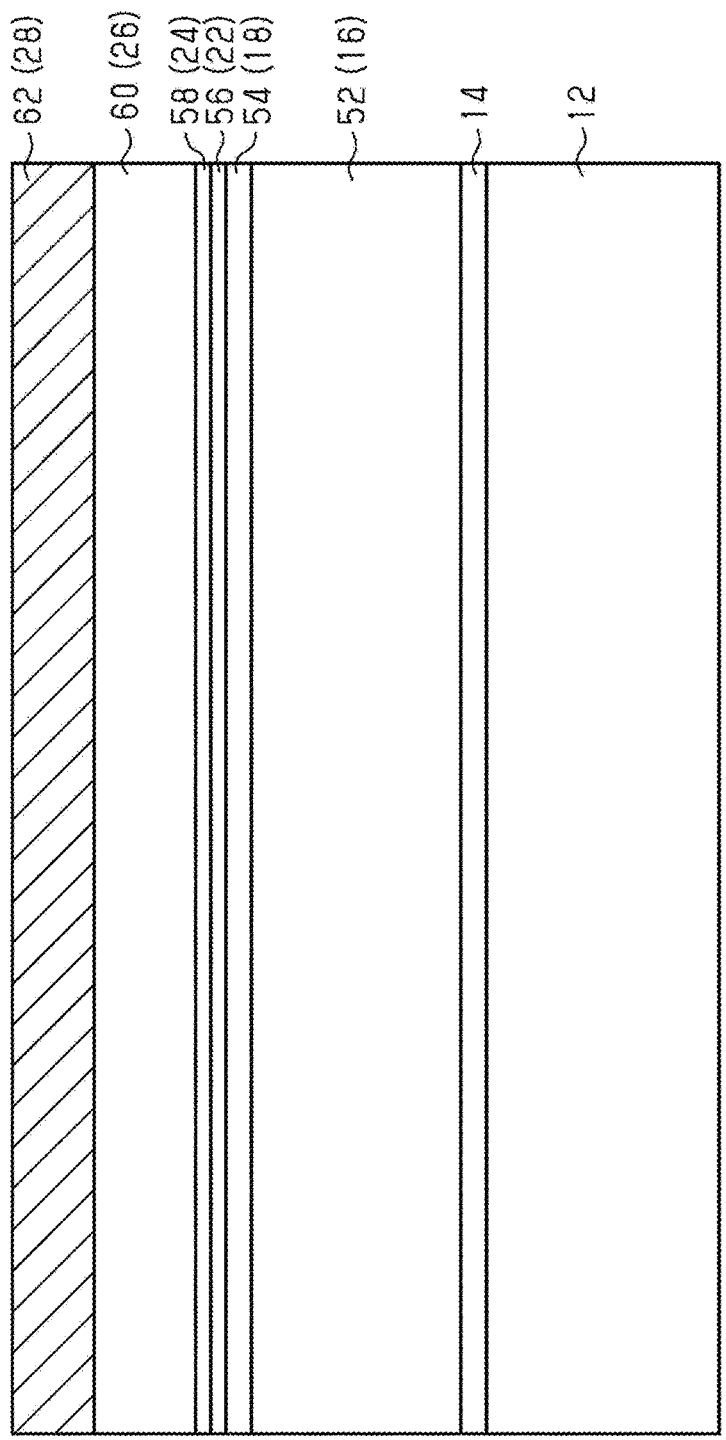
FIG. 6 is a brief section diagram of a manufacturing step following that in FIG. 5.
Figure 7:
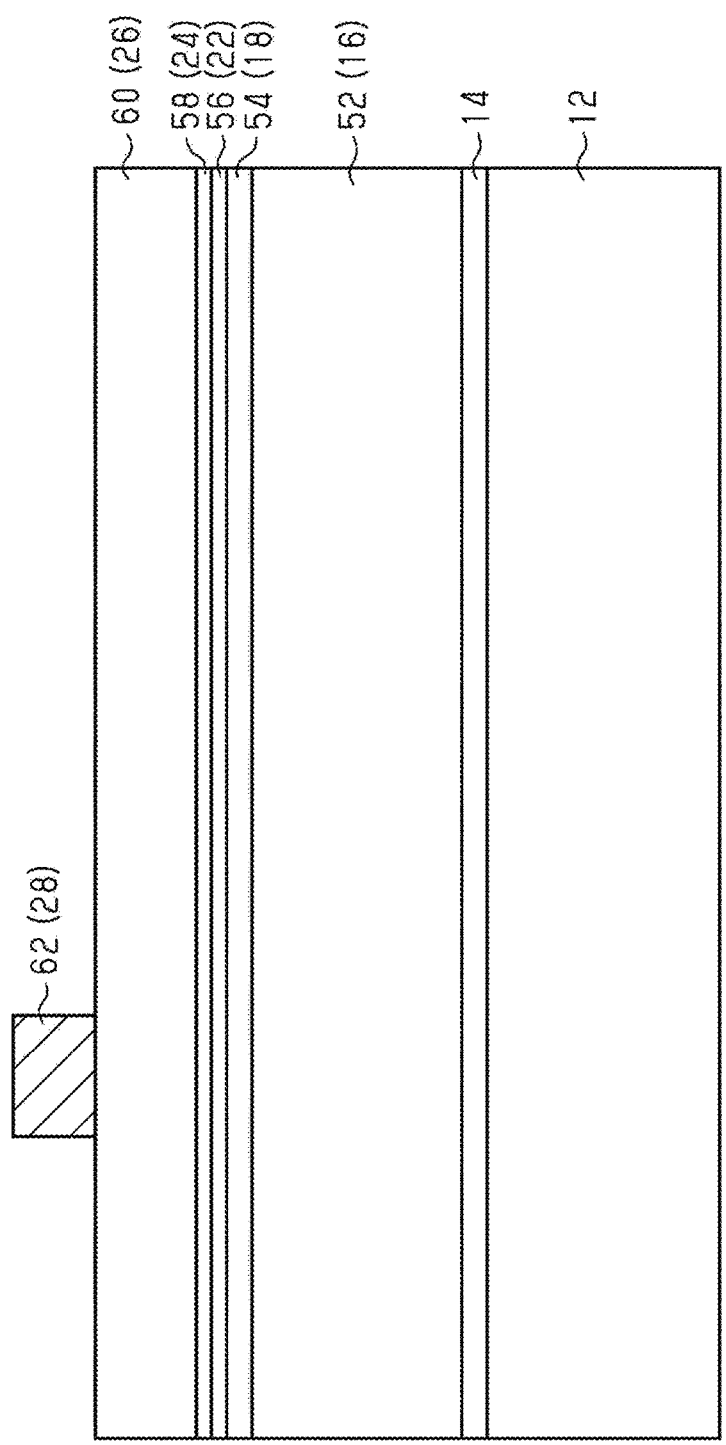
FIG. 7 is a brief section diagram of a manufacturing step following that in FIG. 6.

As shown in FIG. 6 and FIG. 7, the manufacturing method for the nitride semiconductor device 10 further includes a step of forming the gate electrode 28 on the fifth nitride semiconductor layer 60. First of all, as shown in FIG. 6, a metal layer 62 is formed on the fifth nitride semiconductor layer 60. In the first embodiment, a TiN layer as the metal layer 62 is formed, for example, by means of sputtering.

Next, as shown in FIG. 7, the metal layer 62 is selectively etched to form the gate electrode 28. For example, at a position corresponding to an area where the gate electrode 28 is disposed, a mask (omitted from the drawings) is formed on an upper surface of the metal layer 62 in FIG. 6. Then, the metal layer 62 is etched (for example, dry etching) by using the mask to form the gate electrode 28. Next, the mask is removed by using, for example, a stripping fluid.

Figure 8:
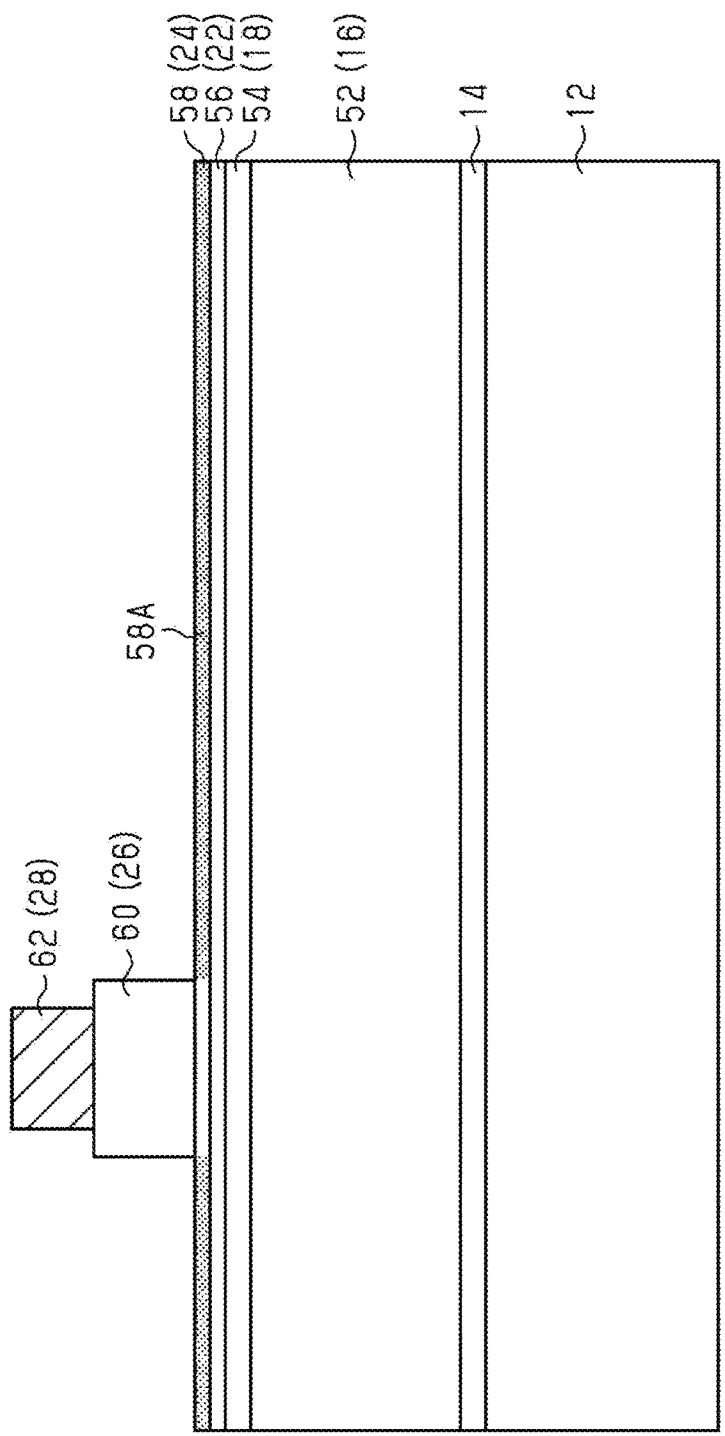
FIG. 8 is a brief section diagram of a manufacturing step following that in FIG. 7.

As shown in FIG. 8, the manufacturing method for the nitride semiconductor device 10 further includes a step of using the fourth nitride semiconductor layer 58 as an etch stop layer to selectively etch the fifth nitride semiconductor layer 60, accordingly forming the gate layer 26. In this step, for example, at a position corresponding to an area where the gate layer 26 is disposed, a mask (omitted from the drawings) covering the gate electrode 28 is formed on an upper surface of the fifth nitride semiconductor layer 60 in FIG. 7. Then, the fifth nitride semiconductor layer 60 is etched by using the mask to form the gate layer 26. Moreover, in FIG. 8, the gate layer 26 has a rectangular cross section, but can also have a trapezoidal cross section or a ridged cross section. Next, the mask is removed by using, for example, a stripping fluid.

Moreover, as described above, when the fifth nitride semiconductor layer 60 is etched to form the gate layer 26, the fourth nitride semiconductor layer 58 (a layer forming the second protective layer 24) is used as an etch stop layer. Thus, when etching is performed to form the gate layer 26, etch damage on the second nitride semiconductor layer 54 (the electron supply layer 18) and the third nitride semiconductor layer 56 (a layer forming the first protective layer 22) can be restrained.

Etching of the fifth nitride semiconductor layer 60 can be, for example, dry etching that uses a mixed gas of chlorine-based gas and an additive gas as an etching gas. An example of the chlorine-based gas is chlorine ($Cl_2$) gas or silicon tetrachloride ($SiCl_4$) gas. An example of the additive gas is a nitrogen-containing gas (e.g., $N_2$ gas), argon (Ar), a fluorine-containing gas (e.g., carbon tetrafluoride ($CF_4$) gas), an oxygen-containing gas (e.g., $O_2$ gas), or a combination of two or more of the above.

In the dry etching, etching conditions such as an etching time of the fifth nitride semiconductor layer 60 and an etching selectivity ratio of the fifth nitride semiconductor layer 60 to the fourth nitride semiconductor layer 58 can be modified by changing, for example, the type of the additive gas. Moreover, etching of the fifth nitride semiconductor layer 60 can also be performed by drying etching for multiple times using different etching conditions.

In addition, regarding etching of the fifth nitride semiconductor layer 60, when the upper surface of the fourth nitride semiconductor layer 58 used as an etch stop layer is exposed, etching conditions can also be selected so as to obtain a higher etching selectivity ratio, for example, an etching selectivity ratio of 10 or more. For example, when the upper surface of the fourth nitride semiconductor layer 58 is exposed, a fluorine-containing gas (e.g., carbon tetrafluoride ($CF_4$) gas) or an oxygen-containing gas (e.g., $O_2$ gas) can also be used as an additive gas so as to obtain a higher etching selectivity ratio.

The dry etching can be performed by using, for example, an inductively coupled plasma (ICP) etching device. The ICP etching device includes a plasma generation power supply that supplies power to generate a plasma from an etching gas, and a bias power supply that supplies ion pulling power for pulling ions in the plasma toward an etching target (for example, the fifth nitride semiconductor layer 60). However, associated details are omitted from the drawings. The etching selectivity ratio can also be adjusted by controlling the ion pulling power supplied by the bias power supply.

Moreover, when the fourth nitride semiconductor layer 58 (AlGaN layer) is doped with Zn as an acceptor-type impurity, Zn causes the plasma to emit light once etching of the fifth nitride semiconductor layer 60 reaches the fourth nitride semiconductor layer 58. By determining light emission of the plasma, stop of etching of the fifth nitride semiconductor layer 60 can be more accurately controlled.

The manufacturing method for the nitride semiconductor device 10 further includes a step of oxidizing and removing at least a part of a portion 58A (a dot-shaded portion in FIG. 8) of the fourth nitride semiconductor layer 58 exposed from the gate layer 26.

As shown in FIG. 8, in the first embodiment, the entire of the portion 58A of the fourth nitride semiconductor layer 58 exposed from the gate layer 26 is oxidized. The oxidation treatment can be implemented by, for example, oxygen plasma treatment. For example, a mask (omitted from the drawings) that covers the gate layer 26 and the gate electrode 28 and exposes the portion 58A of the fourth nitride semiconductor layer 58 is formed, and the mask is used to perform oxygen plasma treatment on the portion 58A of the fourth nitride semiconductor layer 58. Thus, the portion of the fourth nitride semiconductor layer 58 located directly below the gate layer 26 is not oxidized.

Moreover, in the first embodiment, the fourth nitride semiconductor layer 58 is an AlGaN layer, and the third nitride semiconductor layer 56 is a GaN layer. It is more difficult to oxidize a GaN layer than an AlGaN layer. Hence, when the portion 58A of the fourth nitride semiconductor layer 58 is oxidized by oxygen plasma treatment, it is unlikely that the third nitride semiconductor layer 56 becomes oxidized.

Figure 9:
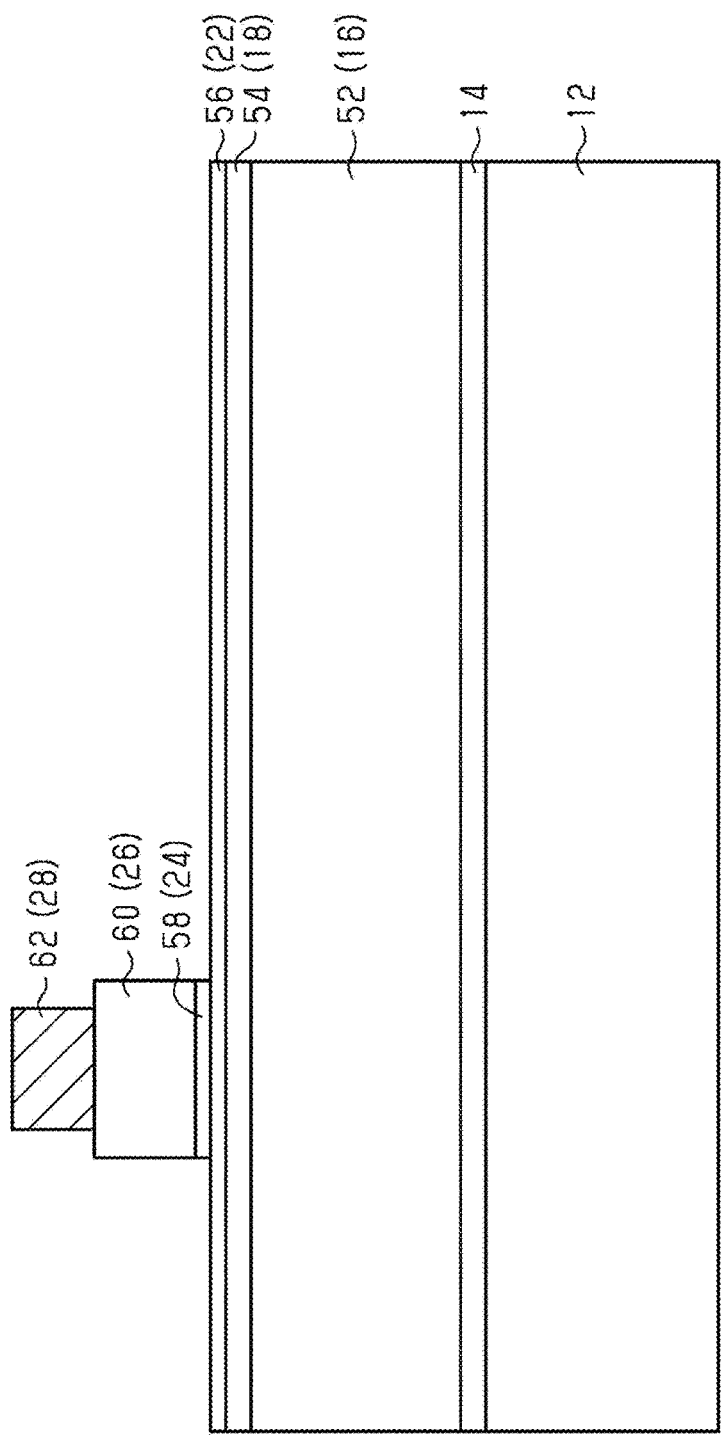
FIG. 9 is a brief section diagram of a manufacturing step following that in FIG. 8.

Next, the oxidized portion 58A of the fourth nitride semiconductor layer 58 is removed by means of etching. Accordingly, as shown in FIG. 9, the second protective layer 22 is formed on a portion of the third nitride semiconductor layer 56 (the layer forming the first protective layer 22). The etching treatment can be, for example, wet etching that uses hydrofluoric acid (HF) as an etching liquid. The wet etching is to continue using the mask used in the oxidation treatment in FIG. 8, and then the mask is removed by using, for example, a stripping liquid.

As such, the portion 58A of the forth nitride semiconductor layer 58 is removed by means of wet etching, and compared to when dry etching (plasma etching) is used, etch damage resulted on the third nitride semiconductor layer 56 (the layer forming the first protective layer 22) can be restrained. Particularly, in the first embodiment, the fourth nitride semiconductor layer 58 is an AlGaN layer, and the third nitride semiconductor layer 56 is a GaN layer. A GaN layer is less likely to be damaged by wet etching compared to an AlGaN layer. Thus, the first protective layer 22 with less damage can be formed.

In addition, the portion 58A of the fourth nitride semiconductor layer 58 removed by the step in FIG. 9 is a portion used as an etch stop layer when dry etching (plasma etching) is performed on the fifth nitride semiconductor layer 60 to form the gate layer 26. Thus, the portion 58A of the fourth nitride semiconductor layer 58 is a portion damaged by the dry etching. The damaged portion 58A is removed by the wet etching in FIG. 9. Thus, the nitride semiconductor device 10 (refer to FIG. 1) manufactured as a final device does not contain the portion 58A that is a result of damage of the dry etching performed on the fifth nitride semiconductor layer 60.

Figure 10:
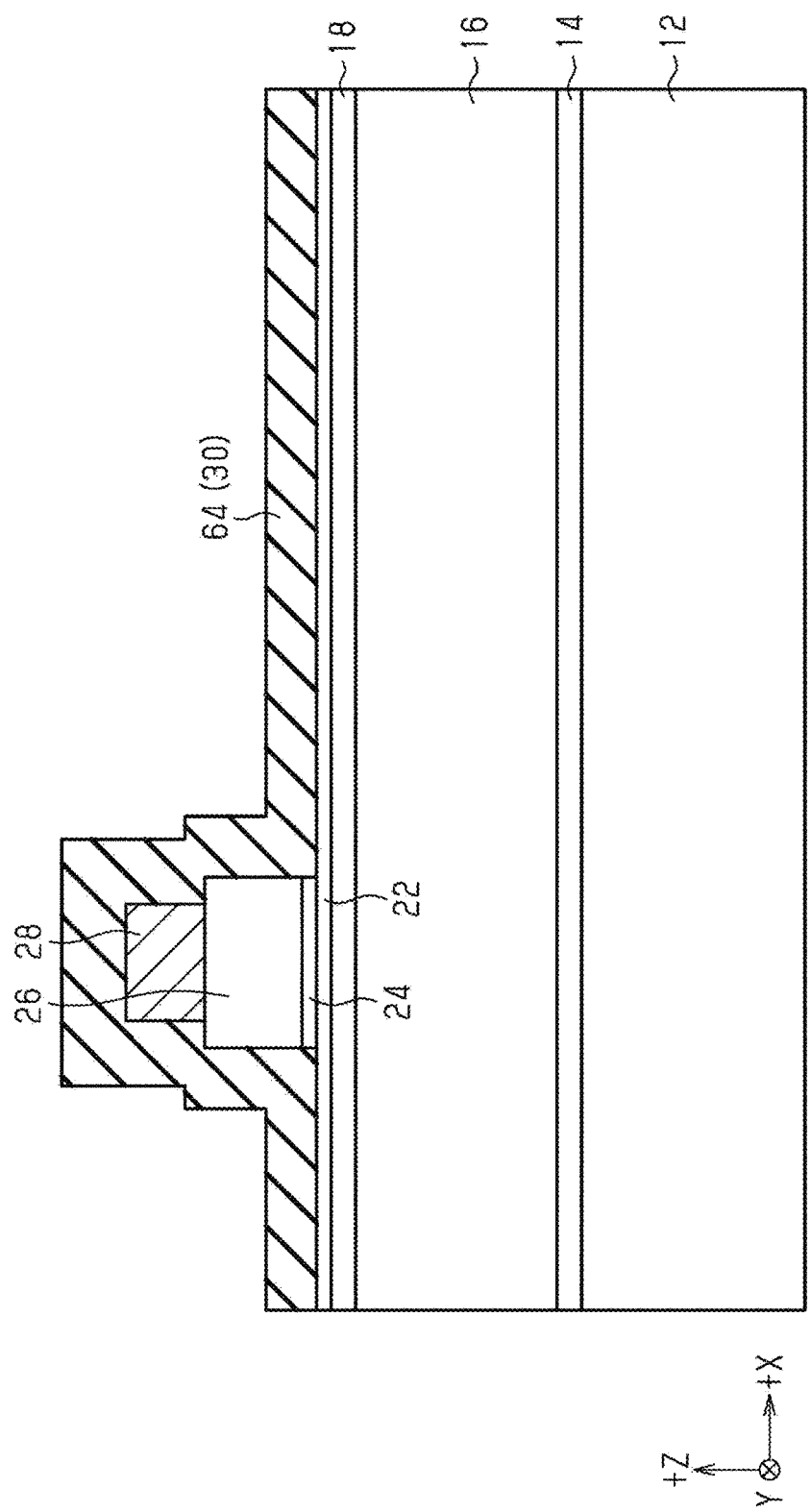
FIG. 10 is a brief section diagram of a manufacturing step following that in FIG. 9.

As shown in FIG. 10, the manufacturing method for the nitride semiconductor device 10 further includes a step of forming a dielectric layer 64 on the first protective layer 22 to cover the second protective layer 24, the gate layer 26 and the gate electrode 28. The dielectric layer 64 corresponds to the passivation layer 30 in FIG. 1. In the first embodiment, for example, a SiN layer is formed as the dielectric layer 64.

Figure 11:
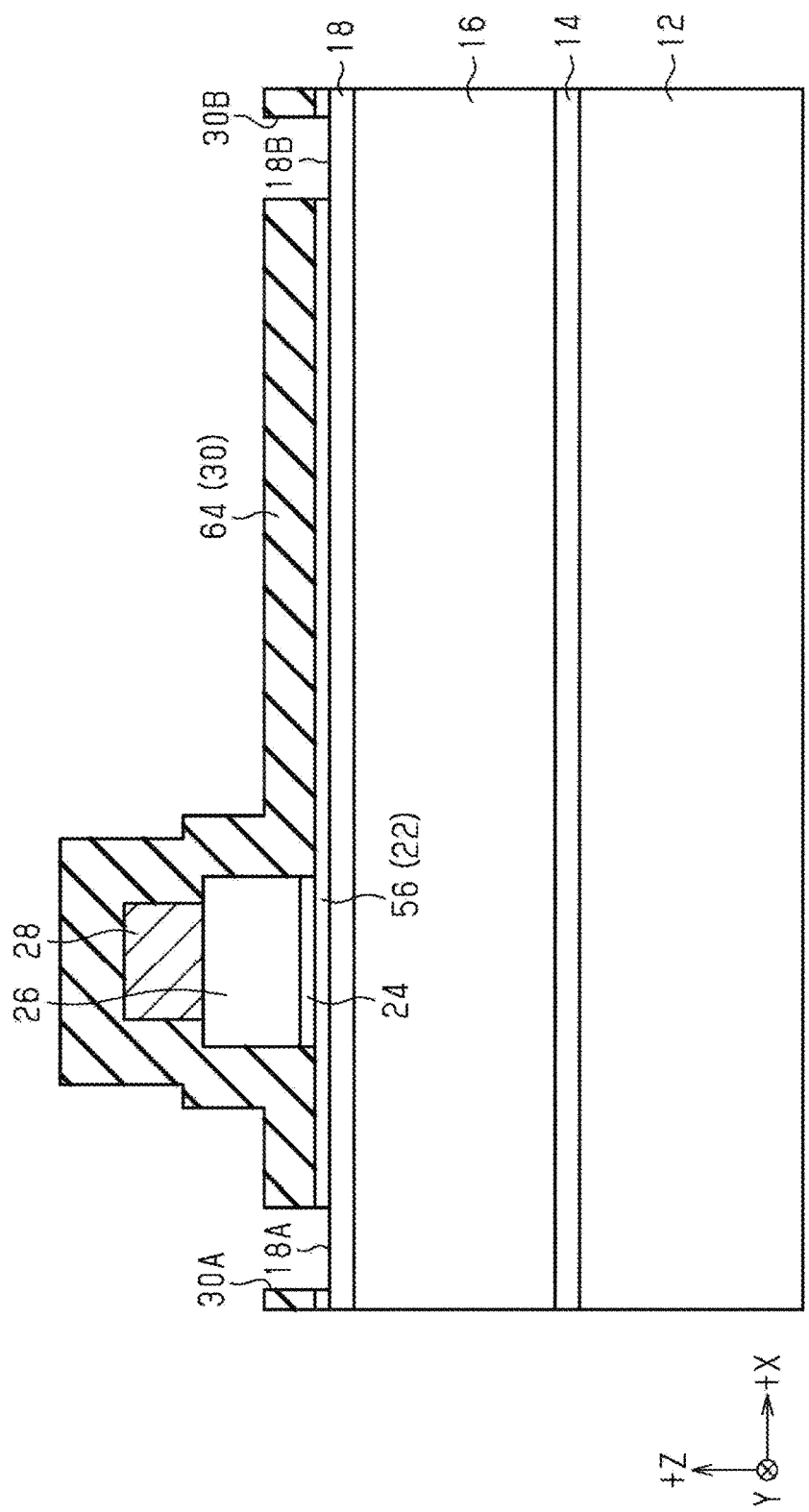
FIG. 11 is a brief section diagram of a manufacturing step following that in FIG. 10.

As shown in FIG. 11, the manufacturing method for the nitride semiconductor device 10 further includes a step forming the source-side through hole 30A and the drain-side through hole 30B passing through the dielectric layer 64 (the passivation layer 30) and the source-side opening 22A and the drain-side opening 22B passing through the third nitride semiconductor layer 56 (the first protective layer 22). The source-side opening 22A communicates with the source-side through hole 30A, and exposes a portion of the upper surface of the electron supply layer 18 as the source contact 18A. The drain-side opening 22B communicates with the drain-side through hole 30B, and exposes a portion of the upper surface of the electron supply layer 18 as the drain contact 18B.

After the step in FIG. 11, the manufacturing method for the nitride semiconductor device 10 further includes a step of forming the source electrode 32 (refer to FIG. 1) and the drain electrode 34 (refer to FIG. 1) connected with the electron supply layer 18. In this step, the source-side through hole 30A and the drain-side through hole 30B are filled to form one or more metal layers covering the passivation layer 30. Then, the metal layer is patterned by means of lithography and etching to accordingly form the source electrode 32 and the drain electrode 34. As such, the nitride semiconductor device 10 in FIG. 1 can be obtained.

Next, functions of the nitride semiconductor device 10 in FIG. 1 are described below.

As shown in FIG. 1, the nitride semiconductor device 10 includes: the first protective layer 22, disposed on the upper surface of the electron supply layer 18 excluding the source contact 18A and the drain contact 18B; and the second protective layer 24, located in an area directly below the gate electrode 28, and disposed on the first protective layer 22. As shown in FIG. 8, the first protective layer 22 is formed by the third nitride semiconductor layer 56, and the second protective layer 24 is formed by the fourth nitride semiconductor layer 58.

The fourth nitride semiconductor layer 58 is used as an etch stop layer when the fifth nitride semiconductor layer 60 is patterned by means of dry etching to form the gate layer 26. Thus, when dry etching is performed to form the gate layer 26, etch damage on the third nitride semiconductor layer 56 (the layer forming the first protective layer 22) as a layer located below the fourth nitride semiconductor layer 58 (the layer forming the second protective layer 24) and on the second nitride semiconductor layer 54 (the electron supply layer 18) can be restrained.

The portion 58A (the portion shaded by dots in FIG. 8) of the fourth nitride semiconductor layer 58 exposed from the gate layer 26 is used as an etch stop layer and is thus damaged by dry etching. The portion 58A of the fourth nitride semiconductor layer 58 that is damaged is removed by means of wet etching (refer to FIG. 9). Thus, the nitride semiconductor device 10 (refer to FIG. 1) manufactured as a final device does not contain the portion 58A that is a result of damage of the dry etching. An etched surface, and more particularly a dry etched surface, is prone to electron trapping that leads to current collapse. Hence, if the portion 58A damaged by dry etching is present in the nitride semiconductor device 10, electrons can be easily trapped at the portion 58A to thereby cause current collapse. Therefore, by removing the portion 58A damaged by dry etching, current collapse caused by the portion 58A damaged by dry etching can be prevented.

Moreover, since the portion 58A is removed by means of wet etching, compared to when dry etching is used, etch damage resulted on the third nitride semiconductor layer 56 (the layer forming the first protective layer 22) can be restrained. Particularly, in the first embodiment, the fourth nitride semiconductor layer 58 is an AlGaN layer, and the third nitride semiconductor layer 56 is a GaN layer. A GaN layer is less likely to be damaged by wet etching using HF compared to an AlGaN layer. Thus, the first protective layer 22 with less damage can be formed, thereby inhibiting the occurrence of current collapse.

The nitride semiconductor device 10 of the first embodiment provides the following advantages.

(1-1) The nitride semiconductor device 10 includes the first protective layer 22 disposed on the electron supply layer 18, and the second protective layer 24 disposed on a portion of the first protective layer 22. The first protective layer 22 is formed by the third nitride semiconductor layer 56, and the second protective layer 24 is formed by the fourth nitride semiconductor layer 58 (refer to FIG. 8).

According to the configuration above, the electron supply layer 18 is protected by the first protective layer 22, and so damage caused on the electron supply layer 18 can be restrained. In addition, the fourth nitride semiconductor layer 58 is used as an etch stop layer when the fifth nitride semiconductor layer 60 is patterned by means of dry etching to form the gate layer 26. Thus, when dry etching is performed to form the gate layer 26, etch damage on the third nitride semiconductor layer 56 (the layer forming the first protective layer 22) as a layer located below the fourth nitride semiconductor layer 58 (the layer forming the second protective layer 24) and on the second nitride semiconductor layer 54 (the electron supply layer 18) can be restrained. Accordingly, current collapse as a result of the damage caused by the dry etching on the first protective layer 22 and the electron supply layer 18 can be inhibited, thereby enhancing reliability of the nitride semiconductor device 10 (nitride semiconductor HEMT).

(1-2) The portion 58A (refer to FIG. 8) of the fourth nitride semiconductor layer 58 that is damaged by dry etching of the fifth nitride semiconductor layer 60 is removed by means of wet etching (refer to FIG. 9). Thus, the nitride semiconductor device 10 (refer to FIG. 1) manufactured as a final device does not contain the portion 58A that is a result of damage of the dry etching. Therefore, current collapse resulted by the portion 58A damaged by dry etching can be prevented.

(1-3) When the portion 58A damaged by dry etching is to be removed, the third nitride semiconductor layer 56 (the layer forming the first protective layer 22) that protects the second nitride semiconductor layer 54 (the electron supply layer 18) is present as a layer below the portion 58A. Accordingly, the electron supply layer 18 is not damaged when the damaged portion 58A is removed. Thus, the occurrence of current collapse on the upper surface of the electron supply layer 18 can be inhibited.

(1-4) The portion 58A that is damaged by dry etching is removed by means of wet etching. Compared to when dry etching is used, the use of wet etching can restrain etch damage resulted on the third nitride semiconductor layer 56 (the layer forming the first protective layer 22).

(1-5) The first protective layer 22 disposed on the electron supply layer 18 also provides a function of hole diffusion. For example, when a larger positive bias is applied to the gate electrode 28, holes injected from the gate electrode 28 into the gate layer 26 are diffused in the first protective layer 22. Accordingly, the density of holes at a junction interface between the first protective layer 22 and the electron supply layer 18 can be reduced, thereby suppressing a gate leakage current.

(1-6) The area of the second protective layer 24 is same as the area of the bottom surface of the gate layer 26 in a top plan view. In this configuration, the portion 58A of the fourth nitride semiconductor layer 58 that is damaged by dry etching of the fifth nitride semiconductor layer 60 is completely removed. Therefore, current collapse resulted by the portion 58A damaged by dry etching can be prevented.

(1-7) The first protective layer 22 is disposed on the upper surface of the electron supply layer 18 excluding the source contact 18A and the drain contact 18B. In this configuration, on the basis that conduction of the source contact 18A of the electron supply layer 18 and the source electrode 32 and conduction of the drain contact 18B of the electron supply layer 18 and the drain electrode 34 are maintained, the first protective layer 22 is used to cover substantially the entire upper surface of the electron supply layer 18. Thus, the occurrence of current collapse can be inhibited on the entire upper surface of the electron supply layer 18 between the source and the drain. A hole diffusion effect of the first protective layer 22 can be further enhanced.

(1-8) The second protective layer 24 has a thickness less than the thickness of the electron supply layer 18 and has a band gap less than the band gap of the electron supply layer 18. According to the configuration above, 2DEG can be suppressed from generating in the first protective layer 22 near the junction interface between the first protective layer 22 and the second protective layer 24, thereby hindering depletion of 2DEG 20 in the electron transport layer 16. Accordingly, reliability of the normally closed operation can be enhanced.

(1-9) At least one of the first protective layer 22 and the second protective layer 24 contains an acceptor-type impurity. According to the configuration above, during zero bias, in the region directly below the gate layer 26, the effect for depleting the 2DEG 20 in the electron transport layer 16 can be improved, thereby enhancing the reliability of the normally closed operation.

(1-10) The first protective layer 22 has a thickness less than the thickness of the gate layer 26. According to the configuration above, reliability of the normally closed operation can be enhanced and on resistance can be reduced.

(1-11) In the first embodiment, the fourth nitride semiconductor layer 58 (the layer forming the second protective layer 24) is an AlGaN layer, and the third nitride semiconductor layer 56 (the layer forming the first protective layer 22) is a GaN layer. A GaN layer is less likely to be damaged by wet etching compared to an AlGaN layer. Thus, when the part 58A damaged by dry etching is removed, etch damage on the first protective layer 22 can be restrained. As a result, the first protective layer 22 with less damage can be formed, thereby inhibiting the occurrence of current collapse.

Second Embodiment

Figure 12:
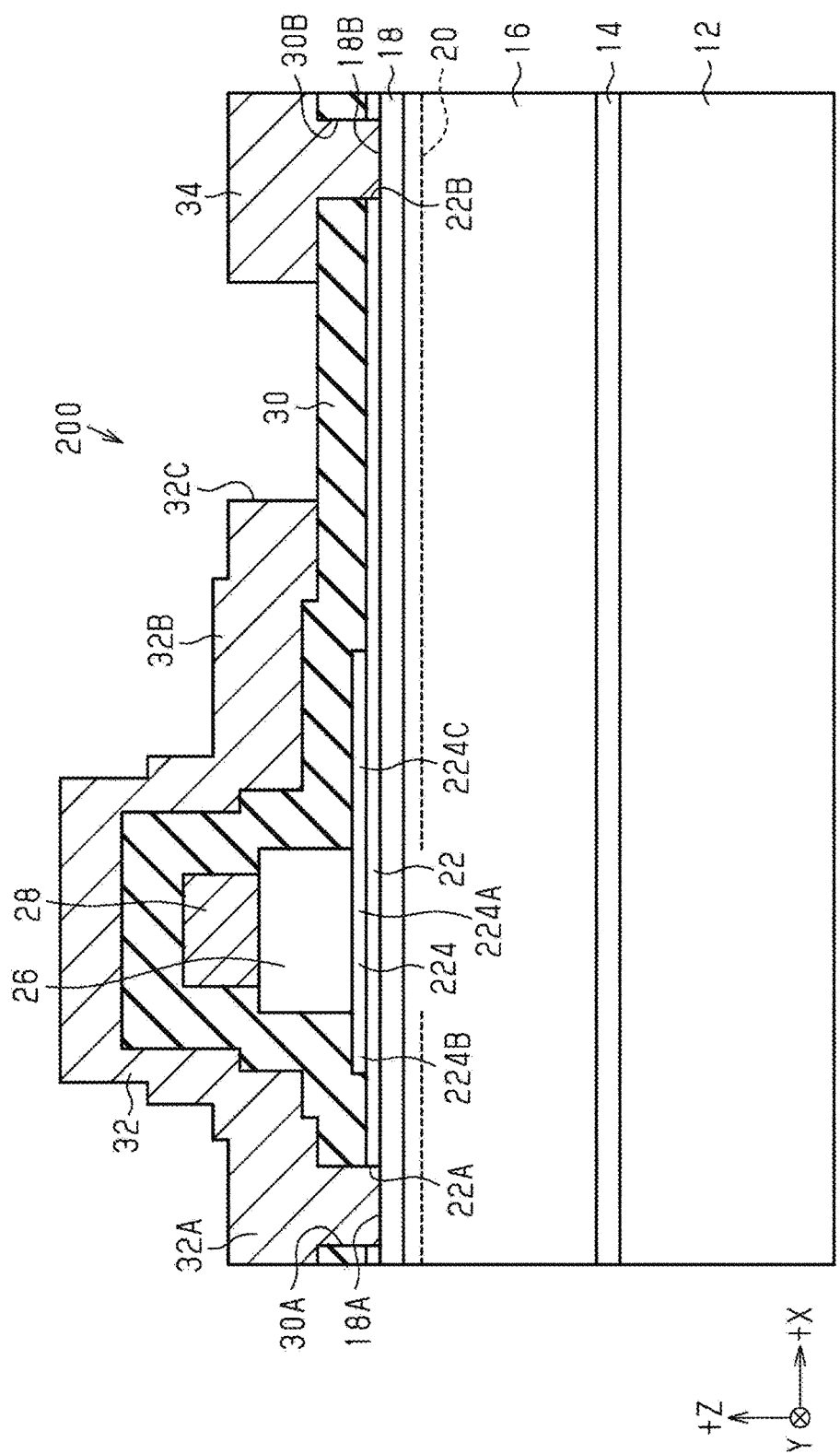
FIG. 12 is a brief section diagram of an exemplary nitride semiconductor device according to a second embodiment.

FIG. 12 shows a brief section diagram of an exemplary nitride semiconductor device 200 according to a second embodiment. In FIG. 12, constituting elements common with those of the first embodiment are represented by the same numerals and symbols. In the description below, associated details of the constituting elements common with those of the first embodiment are omitted for brevity, and only details of constituting elements different from those of the first embodiment are described.

The nitride semiconductor device 200 includes a second protective layer 224 in substitution for the second protective layer 24 of the first embodiment (refer to FIG. 1). An area of the second protective layer 224 of the second embodiment is larger than the area of the bottom surface of the gate layer 26 in a top plan view. Except for the difference in terms of the area of the bottom surface of the gate layer 26, the second protective layer 224 of the second embodiment can be identically structured as the second protective layer 24 of the first embodiment. For example, the second protective layer 224 of the second embodiment can be an AlGaN layer, and can have the same characteristics as the AlGaN layer forming the second protective layer 24 of the first embodiment.

The second protective layer 224 includes a base portion 224A, a source-side extension portion 224B and a drain-side extension portion 224C. The base portion 224A is located directly below the bottom surface of the gate layer 26. The source-side extension portion 224B is located outside the bottom surface of the gate layer 26 in a top plan view, and extends from the base portion 224A toward the source contact 18A. The drain-side extension portion 224C is located outside the bottom surface of the gate layer 26 in a top plan view, and extends from the base portion 224A toward the drain contact 18B. The source-side extension portion 224B and the drain-side extension portion 224C can have a same thickness as a thickness of the base portion 224A.

The second protective layer 224 of the second embodiment is formed by a same step as the step for forming the second protective layer 24 (refer to FIG. 8 and FIG. 9) of the first embodiment, that is, by oxidizing and removing only a part of a portion of the fourth nitride semiconductor layer 58 exposed from the gate layer 26.

In addition to the advantages (1-1) to (1-5) and (1-7) to (1-11) of the first embodiment, the nitride semiconductor device 200 of the second embodiment further provides the advantages below.

(2-1) The area of the second protective layer 224 is larger than the area of the bottom surface of the gate layer 26 in a top plan view. In this configuration, the second protective layer 224 has the source-side extension portion 224B and the drain-side extension portion 224C. Thus, compared to when the second protective layer 24 of the first embodiment is used, the effect of hole diffusion of the second protective layer 224 can be enhanced.

Third Embodiment

Figure 13:
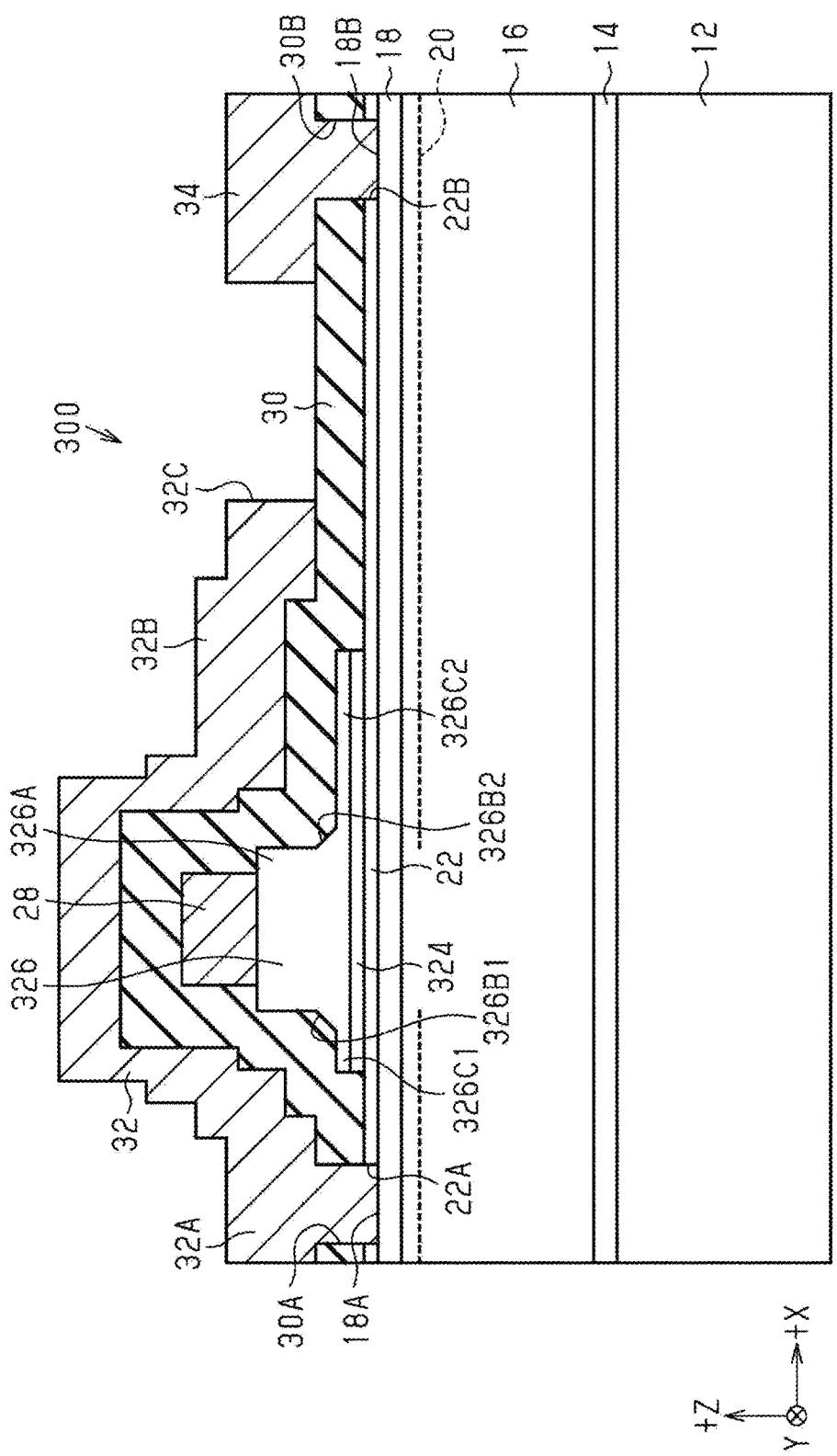
FIG. 13 is a brief section diagram of an exemplary nitride semiconductor device according to a third embodiment.

FIG. 3 shows a brief section diagram of an exemplary nitride semiconductor device 300 according to a third embodiment. In FIG. 13, constituting elements common with those of the first embodiment are represented by the same numerals and symbols. In the description below, associated details of the constituting elements common with those of the first embodiment are omitted for brevity, and only details of constituting elements different from those of the first embodiment are described.

The nitride semiconductor device 300 includes a second protective layer 324 in substitution for the second protective layer 24 of the first embodiment (refer to FIG. 1), and includes a gate layer 326 in substitution for the gate layer 26 of the first embodiment (refer to FIG. 1). In the third embodiment, an area of the second protective layer 324 is same as an area of a bottom surface of the gate layer 326 in a top plan view. Except for the difference in terms of being larger than the second protective layer 24 of the first embodiment, the second protective layer 324 of the third embodiment can be identically structured as the second protective layer 24 of the first embodiment. For example, the second protective layer 324 of the third embodiment can be an AlGaN layer, and can have the same characteristics as the AlGaN layer forming the second protective layer 24 of the first embodiment.

The gate layer 326 of the third embodiment includes a gate body 326A on which the gate electrode 28 is located, and inclined portions 326B1 and 326B2 inclined outwardly from a side surface of the gate body 326A. The gate layer 326 further includes a flat portion 326C1 extending from the inclined portion 326B1 along the second protective layer 324 to the source contact 18A, and a flat portion 326C2 extending from the inclined portion 326B2 along the second protective layer 324 to the drain contact 18B. The gate layer 326 of the third embodiment is formed by a same step as the step for forming the gate layer 26 (refer to FIG. 7) of the first embodiment, that is, by patterning the fifth nitride semiconductor layer 60 by means of etching into the shape of the gate layer 326 shown in FIG. 11.

Except for the difference in terms of a shape different from that of the gate layer 26 of the first embodiment, the gate layer 326 of the third embodiment can be identically structured as the gate layer 26 of the first embodiment. For example, the gate layer 326 of the third embodiment can be a GaN layer (or a p-type GaN layer), and can have the same characteristics as the GaN layer forming the gate layer 26 of the first embodiment.

In the third embodiment, a length (a width) of the flat portion 326C2 extending from the inclined portion 326B2 to the drain contact 18B (toward the +X direction) is greater than a length (a width) of the flat portion 326C1 extending from the inclined portion 326B1 to the source contact 18A (toward the −X direction). In this configuration, the passivation layer 30 located between the source field plate portion 32B and the 2DEG 20 is thinner than that of the first embodiment. Accordingly, a depletion layer can be extended more effectively from the source field plate portion 32B to the 2DEG 20, thereby inhibiting the occurrence of current collapse.

In the third embodiment, a bottom surface of the gate layer 326 includes a bottom surface of the gate body 326A, bottom surfaces of the inclined portions 326B1 and 326B2, and bottom surfaces of the flat portions 326C1 and 326C2. The second protective layer 324 of the third embodiment is formed in a region directly below the bottom surface of the gate layer 326. The second protective layer 324 is formed by a same step as the step for forming the second protective layer 24 (refer to FIG. 8 and FIG. 9) of the first embodiment, that is, by oxidizing and removing entire of a portion of the fourth nitride semiconductor layer 58 exposed from the gate layer 326.

In addition to the advantages (1-1) to (1-11) of the first embodiment, the nitride semiconductor device 300 of the third embodiment further provides the advantages below.

(3-1) The gate layer 326 includes the gate body 326A, the inclined portions 326B1 and 326B2, and the flat portions 326C1 and 326C2. By extending the flat portion 326C2 from the inclined portion 326B2 to the drain contact 18B, the effect of inhibiting current collapse by using the source field plate portion 32B can be enhanced.

(3-2) Because the gate layer 326 includes the inclined portions 326B1 and 326B2 and the flat portions 326C1 and 326C2, an effect of hole diffusion of the gate layer 326 can be achieved.

(3-3) The second protective layer 325 is located in the region directly below the bottom surface of the gate layer 326. Thus, in addition to the bottom surface of the gate body 326A, the second protective layer 324 further exists in regions directly below the bottom surfaces of the inclined portions 326B1 and 326B2 and the bottom surfaces of the flat portions 326C1 and 326C2. Accordingly, compared to the second protective layer 24 of the first embodiment is used, the effect of hole diffusion of the second protective layer 224 can be enhanced.

Variation Examples

The embodiments described above can be implemented according to the variations below. The embodiments described above and the variation examples can be implemented in combination, given that they are not technically contradictory.

In the embodiments, an acceptor-type impurity can be doped in only a partial region of the first protective layer 22. For example, an acceptor-type impurity can be doped in a region directly below the gate layer 26 (the gate body 326A of the third embodiment) in a top plan view. According to the configuration above, reliability of the normally closed operation can be enhanced.

The gate electrode 28 of the embodiments can be disposed on only at least a portion of the gate layer 26. For example, in the first and second embodiments, the gate electrode 28 can be disposed over the entire gate layer 26. Similarly, in the third embodiment, the gate electrode 28 can also be disposed over the entire gate body 326A.

In the second protective layer 224 of the second embodiment, the source-side extension portion 224B and the drain-side extension portion 224C can have a thickness less than a thickness of the base portion 224A. Moreover, the source-side extension portion 224B and the drain-side extension portion 224C can have the same length (width).

The gate layer 326 of the third embodiment can exclude the flat portions 326C1 and 326C2. The gate layer 326 is formed by etching the fifth nitride semiconductor layer 60 (refer to FIG. 7). Thus, the flat portions 326C1 and 326C2 are damaged by etching. If the flat portions 326C1 and 326C2 are not formed, a portion that is damaged by etching can be reduced.

In the gate layer 326 of the third embodiment, the flat portions 326C1 and 326C2 are not necessarily flat. For example, the flat portion 326C1 can also have a thickness that gradually decreases from the inclined portion 326B1 toward the source contact 18A. Similarly, the flat portion 326C2 can also have a thickness that gradually decreases from the inclined portion 326B2 toward the drain contact 18B.

In the gate layer 326 of the third embodiment, the flat portions 326C1 and 326C2 can have the same length (width).

The gate layer 326 of the third embodiment can exclude the inclined portions 326B1 and 326B2.

The gate layer 326 of the third embodiment can be formed by the gate body 326A, the inclined portion 326B1 and the flat portion 326C1. That is to say, the inclined portion 326B2 and the flat portion 326C2 can be omitted. Alternatively, the gate layer 326 can be formed by the gate body 326A, the inclined portion 326B2 and the flat portion 326C2. That is to say, the inclined portion 326B1 and the flat portion 326C1 can be omitted.

Unless otherwise specified in the context, the term "on/over" used in the present disclosures include meanings of "on", "over" and "above". Thus, the expression "a first layer disposed on a second layer" can refer to that the first layer is in contact with the second layer and directly arranged on the second layer in some embodiments, or can refer to that the first layer is not in contact with the second layer and is configured over or above the second layer. That is to say, the expression "on/over" does not eliminate a structure of another layer between the first layer and the second layer. For example, various embodiments of the electron supply layer 18 disposed on the electron transport layer 16 also include an intermediate layer placed between the electron supply layer 18 and the electron transport layer 16 so as to stably form the 2DEG 20.

The Z-axis direction used in the present disclosure is not necessarily a vertical direction, and is not necessarily completely consistent with the vertical direction. Thus, various structures (for example, the structure shown in FIG. 1) associated with the present disclosure are not limited to "up/top" and "down/bottom" of the Z-axis direction given in the description to be "up" and "down" of the vertical direction. For example, the X-axis direction can also be the vertical direction, or the Y-axis direction can also be the vertical direction.

The directional and spatial terms "vertical", "horizontal", "above", "below", "up/top", "down/bottom", "front", "back", "next to", "left", "right", "before" and "behind" are determined on the basis of specific directions of devices in the description and the drawings. In the present disclosure, various substitutive directions are conceivable, and so these directional and spatial terms are not to be interpreted narrowly or exclusively.

[Notes]

The technical concepts that are conceivable based on the embodiments and the variation examples are recoded in the description below. Moreover, the reference numerals or symbols of the constituting elements embodiment corresponding to the constituting elements described in the notes are marked with parentheses. The numerals or symbols are used for understanding purposes, and the constituting elements in the notes are not to be construed as constituting elements indicated by the numerals or symbols.

(Note A1)

A nitride semiconductor device (10 (10A to 10D), 200, 300), comprising:
- an electron transport layer (16), made of a nitride semiconductor;
- an electron supply layer (18), disposed on the electron transport layer (16) and made of a nitride semiconductor having a band gap greater than a band gap of the nitride semiconductor of the electron transport layer (16);
- a first protective layer (22), disposed on the electron supply layer (18) and made of a nitride semiconductor having a band gap less than the band gap of the nitride semiconductor of the electron supply layer (18);
- a second protective layer (24, 224, 324), disposed on a portion of the first protective layer (22) and made of a nitride semiconductor having a band gap greater than the band gap of the nitride semiconductor of the first protective layer (22);
- a gate layer (26, 326), disposed on the second protective layer (24, 224, 324), made of a nitride semiconductor that has a band gap less than the band gap of the nitride semiconductor of the second protective layer (24, 224, 324), and containing an acceptor-type impurity;
- a gate electrode (28), disposed on the gate layer (26, 326); and
- a source electrode (32) and a drain electrode (34), connected with the electron supply layer (18).

(Note A2)

The nitride semiconductor device (10 (10A to 10D), 300) according to note A1, wherein an area of the second protective layer (24, 324) is same as an area of a bottom surface of the gate layer (26, 326) in a top plan view.

(Note A3)

The nitride semiconductor device (200) according to note A1, wherein an area of the second protective layer (224) is greater than an area of a bottom surface of the gate layer (26) in a top plan view.

(Note A4)

The nitride semiconductor device (200, 300) according to note A2 or A3, wherein the gate layer (26, 326) includes:
- a gate body (326A), on which the gate electrode (28) is located; and
- an inclined portion (326B1, 326B2), inclined outwardly from a side surface of the gate body (326A).

(Note A5)

The nitride semiconductor device (200, 300) according to note A4, wherein the gate layer (26, 326) further includes a flat portion (326C1, 326C2) extending from the inclined portion (326B1, 326B2) along the second protective layer (24, 224, 324).

(Note A6)

The nitride semiconductor device (10 (10A to 10D) 200, 300) according to any one of notes A1 to A5, wherein the electron supply layer (18) includes:
- a source contact (18A), in contact with the source electrode (32); and
- a drain contact (18B), in contact with the drain electrode (34), and wherein the first protective layer (22) is disposed on an upper surface of the electron supply layer (18) excluding the source contact (18A) and the drain contact (18B).

(Note A7)

The nitride semiconductor device (10 (10A to 10D) 200, 300) according to any one of notes A1 to A5, further including a passivation layer (30) that is disposed on the first protective layer (22), covers the second protective layer (24, 224, 324), the gate layer (26, 326) and the gate electrode (28) and includes a source-side through hole (30A) and a drain-side through hole (30B), and wherein the first protective layer (22) includes:
- a source-side opening (22A), communicating with the source-side through hole (30A) and exposing a portion of the electron supply layer (18) as a source contact (18A) in contact with the source electrode (32); and
- a drain-side opening (22B), communicating with the drain-side through hole (30B) and exposing a portion of the electron supply layer (18) as a drain contact (18B) in contact with the drain electrode (34).

(Note A8)

The nitride semiconductor device (200) according to note A3, wherein the electron supply layer (18) includes:
- a source contact (18A), in contact with the source electrode (32); and
- a drain contact (18B), in contact with the drain electrode (34), and wherein the second protective layer (224) includes:
- a base portion (224A), located directly below the bottom surface of the gate layer (26);
- a source-side extension portion (224B), located outside the bottom surface of the gate layer (26) in the top plan view and extending from the base portion (224A) toward the source contact (18A); and
- a drain-side extension portion (224C), located outside the bottom surface of the gate layer (26) in the top plan view and extending from the base portion (224A) toward the drain contact (18B).

(Note A9)

The nitride semiconductor device (200) according to note A8, wherein the source-side extension portion (224B) and the drain-side extension portion (224C) have a same thickness as a thickness of the base portion (224A).

(Note A10)

The nitride semiconductor device (10 (10A to 10D) 200, 300) according to any one of notes A1 to A9, wherein the second protective layer (24, 224, 324) has a thickness less than a thickness of the electron supply layer (18) and has a band gap less than a band gap of the electron supply layer (18).

(Note A11)

The nitride semiconductor device (10 (10A to 10D) 200, 300) according to any one of notes A1 to A10, wherein at least one of the first protective layer (22) and the second protective layer (24, 224, 324) contains an acceptor-type impurity.

(Note A12)

The nitride semiconductor device (10 (10A to 10D) 200, 300) according to any one of notes A1 to A11, wherein the first protective layer (22) has a thickness less than a thickness of the gate layer (26, 326).

(Note A13)

The nitride semiconductor device (10 (10A to 10D) 200, 300) according to any one of notes A1 to A12, wherein the electron transport layer (16) is a GaN layer, the electron supply layer (18) is an AlGaN layer, the first protective layer (22) is a GaN layer, the second protective layer (24, 224, 324) is an AlGaN layer having an Al composition less than an Al composition of the electron supply layer (18), and wherein the gate layer (26, 326) is a GaN layer containing at least one of Mg and Zn as an acceptor type impurity.

(Note A14)

The nitride semiconductor device (10 (10A to 10D) 200, 300) according to note A13, wherein the electron supply layer (18) is an $Al_xGa_{1-x}N$ layer (wherein 0.1<x<0.3), and the second protective layer (24, 224, 324) is an $Al_yGa_{1-y}N$ layer (wherein 0.05<y<x).

(Note A15)

The nitride semiconductor device (10 (10A to 10D) 200, 300) according to note A13 or A14, wherein at least one of the first protective layer (22) and the second protective layer (24, 224, 324) contains at least one of Mg and Zn as an acceptor-type impurity.

(Note A16)

The nitride semiconductor device (10 (10A to 10D) 200, 300) according to any one of notes A1 to A15, wherein a thickness of the electron supply layer (18) is 20 nm or less, and a thickness of the second protective layer (24, 224, 324) is 10 nm or less.

(Note A17)

The nitride semiconductor device (10 (10A to 10D) 200, 300) according to any one of notes A1 to A16, wherein the thickness of the electron supply layer (18) is 15 nm or less, and the thickness of the second protective layer (24, 224, 324) is 7 nm or less.

(Note B1)

A manufacturing method for a nitride semiconductor device (10), comprising:
  forming a first nitride semiconductor layer (52) that forms an electron transport layer (16);
  forming a second nitride semiconductor layer (54) on the first nitride semiconductor layer (52), wherein the second nitride semiconductor layer (54) has a band gap greater than a band gap of the first nitride semiconductor layer (52) and forms an electron supply support layer (18);
  forming a third nitride semiconductor layer (56) on the second nitride semiconductor layer (54), wherein the third nitride semiconductor layer (56) has a band gap less than the band gap of the second nitride semiconductor layer (54);
  forming a fourth nitride semiconductor layer (58) on the third nitride semiconductor layer (56), wherein the fourth nitride semiconductor layer (58) has a band gap greater than the band gap of the third nitride semiconductor layer (56);
  forming a fifth nitride semiconductor layer (60) on the fourth nitride semiconductor layer (58), wherein the fifth nitride semiconductor layer (60) has a band gap less than the band gap of the fourth nitride semiconductor layer (58) and contains an acceptor-type impurity;
  forming a gate electrode (28) on the fifth nitride semiconductor layer (60);
  using the fourth nitride semiconductor layer (58) as an etch stop layer to selectively etch the fifth nitride semiconductor layer (60), accordingly forming a gate layer (26, 326); and
  oxidizing and removing at least a part of a portion (58A) of the fourth nitride semiconductor layer (58) exposed from the gate layer (26, 326).

(Note B2)

The manufacturing method for the nitride semiconductor device (10) according to note B1, wherein the step of oxidizing and removing the at least a part of the portion (58A) of the fourth nitride semiconductor layer (58) exposed from the gate layer (26, 326) includes:
  oxidizing entire of the portion (58A) of the fourth nitride semiconductor layer (58) exposed from the gate layer (26, 326); and
  removing entire of the oxidized portion (58A) of the fourth nitride semiconductor layer (58) by means of wet etching.

(Note B3)

The manufacturing method for the nitride semiconductor device (10) according to note B2, wherein the wet etching is wet etching using hydrofluoric acid (HF).

It should be noted that the description above are for illustrative and exemplary purposes. It can be conceived by the industrialist that, apart from the constituting elements and methods (manufacturing processes) enumerated in the technical details of the present disclosure, there are many other conceivable combinations and substitutions. The present disclosure is intended to encompass all substitutions, modifications and variations covered by the scope of claims of the present disclosure.

The invention claimed is:

1. A nitride semiconductor device, comprising:
    an electron transport layer, made of a nitride semiconductor;
    an electron supply layer, disposed on the electron transport layer and made of a nitride semiconductor having a band gap greater than a band gap of the nitride semiconductor of the electron transport layer;
    a first protective layer, disposed on the electron supply layer and made of a nitride semiconductor having a band gap less than the band gap of the nitride semiconductor of the electron supply layer;
    a second protective layer, disposed on a portion of the first protective layer and made of a nitride semiconductor having a band gap greater than the band gap of the nitride semiconductor of the first protective layer;
    a gate layer, disposed on the second protective layer and made of a nitride semiconductor that has a band gap less than the band gap of the nitride semiconductor of the second protective layer and contains acceptor-type impurities;
    a gate electrode, disposed on the gate layer; and
    a source electrode and a drain electrode, connected with the electron supply layer, wherein
    an area of the second protective layer is same as an area of a bottom surface of the gate layer in a top plan view,
    the gate layer includes:
      a gate body, on which the gate electrode is located; and
      an inclined portion, inclined outwardly from a side surface of the gate body, and
    the gate layer further includes a flat portion extending from the inclined portion along the second protective layer.

2. The nitride semiconductor device of claim 1, wherein the electron supply layer includes:
    a source contact, in contact with the source electrode; and
    a drain contact, in contact with the drain electrode, wherein
    the first protective layer is disposed on an upper surface of the electron supply layer excluding the source contact and the drain contact.

3. The nitride semiconductor device of claim 1, further comprising a passivation layer that is
    disposed on the first protective layer,
    covering the second protective layer, the gate layer and the gate electrode and
    including a source-side through hole and a drain-side through hole, wherein the first protective layer includes:
   a source-side opening, communicating with the source-side through hole and exposing a portion of the electron supply layer as a source contact in contact with the source electrode; and
   a drain-side opening, communicating with the drain-side through hole and exposing a portion of the electron supply layer as a drain contact in contact with the drain electrode.

4. A nitride semiconductor device, comprising:
an electron transport layer, made of a nitride semiconductor;
an electron supply layer, disposed on the electron transport layer and made of a nitride semiconductor having a band gap greater than a band gap of the nitride semiconductor of the electron transport layer;
a first protective layer, disposed on the electron supply layer and made of a nitride semiconductor having a band gap less than the band gap of the nitride semiconductor of the electron supply layer;
a second protective layer, disposed on a portion of the first protective layer and made of a nitride semiconductor having a band gap greater than the band gap of the nitride semiconductor of the first protective layer;
a gate layer, disposed on the second protective layer and made of a nitride semiconductor that has a band gap less than the band gap of the nitride semiconductor of the second protective layer and contains acceptor-type impurities;
a gate electrode, disposed on the gate layer; and
a source electrode and a drain electrode, connected with the electron supply layer, wherein
an area of the second protective layer is greater than an area of a bottom surface of the gate layer in a top plan view,
the electron supply layer includes:
   a source contact, in contact with the source electrode; and
   a drain contact, in contact with the drain electrode, and
the second protective layer includes:
   a base portion, located directly below the bottom surface of the gate layer;
   a source-side extension portion, located outside the bottom surface of the gate layer in the top plan view and extending from the base portion toward the source contact; and
   a drain-side extension portion, located outside the bottom surface of the gate layer in the top plan view and extending from the base portion toward the drain contact.

5. The nitride semiconductor device of claim 4, wherein the source-side extension portion and the drain-side extension portion have a same thickness as a thickness of the base portion.

6. The nitride semiconductor device of claim 4, wherein the gate layer includes:
a gate body, on which the gate electrode is located;
an inclined portion, inclined outwardly from a side surface of the gate body.

7. A nitride semiconductor device, comprising:
an electron transport layer, made of a nitride semiconductor;
an electron supply layer, disposed on the electron transport layer and made of a nitride semiconductor having a band gap greater than a band gap of the nitride semiconductor of the electron transport layer;
a first protective layer, disposed on the electron supply layer and made of a nitride semiconductor having a band gap less than the band gap of the nitride semiconductor of the electron supply layer;
a second protective layer, disposed on a portion of the first protective layer and made of a nitride semiconductor having a band gap greater than the band gap of the nitride semiconductor of the first protective layer;
a gate layer, disposed on the second protective layer and made of a nitride semiconductor that has a band gap less than the band gap of the nitride semiconductor of the second protective layer and contains acceptor-type impurities;
a gate electrode, disposed on the gate layer; and
a source electrode and a drain electrode, connected with the electron supply layer, wherein
the second protective layer has a thickness less than a thickness of the electron supply layer and has a band gap less than a band gap of the electron supply layer.

8. A nitride semiconductor device, comprising:
an electron transport layer, made of a nitride semiconductor;
an electron supply layer, disposed on the electron transport layer and made of a nitride semiconductor having a band gap greater than a band gap of the nitride semiconductor of the electron transport layer;
a first protective layer, disposed on the electron supply layer and made of a nitride semiconductor having a band gap less than the band gap of the nitride semiconductor of the electron supply layer;
a second protective layer, disposed on a portion of the first protective layer and made of a nitride semiconductor having a band gap greater than the band gap of the nitride semiconductor of the first protective layer;
a gate layer, disposed on the second protective layer and made of a nitride semiconductor that has a band gap less than the band gap of the nitride semiconductor of the second protective layer and contains acceptor-type impurities;
a gate electrode, disposed on the gate layer; and
a source electrode and a drain electrode, connected with the electron supply layer, wherein
the first protective layer has a thickness less than a thickness of the gate layer.

9. The nitride semiconductor device of claim 8, wherein
the electron transport layer is a GaN layer,
the electron supply layer is an AlGaN layer,
the first protective layer is a GaN layer,
the second protective layer is an AlGaN layer having an Al composition less than an Al composition of the electron supply layer, and
the gate layer is a GaN layer containing at least one of Mg and Zn as an acceptor type impurity.

10. The nitride semiconductor device of claim 9, wherein
the electron supply layer is an $Al_xGa_{1-x}N$ layer ($0.1<x<0.3$), and
the second protective layer is an $Al_yGa_{1-y}N$ layer ($0.05<y<x$).

11. The nitride semiconductor device of claim 9, wherein
at least one of the first protective layer and the second protective layer contains at least one of Mg and Zn as an acceptor-type impurity.

12. The nitride semiconductor device of claim 8, wherein
a thickness of the electron supply layer is less than 20 nanometers (nm), and a thickness of the second protective layer is less than 10 nm.

13. The nitride semiconductor device of claim 8, wherein
a thickness of the electron supply layer is less than 15 nm, and
a thickness of the second protective layer is less than 7 nm.

14. The nitride semiconductor device of claim 8, wherein the electron supply layer includes:
a source contact, in contact with the source electrode; and
a drain contact, in contact with the drain electrode, wherein
the first protective layer is disposed on an upper surface of the electron supply layer excluding the source contact and the drain contact.

15. The nitride semiconductor device of claim 8, further comprising a passivation layer that is
disposed on the first protective layer,
covering the second protective layer, the gate layer and the gate electrode, and
including a source-side through hole and a drain-side through hole, wherein
the first protective layer includes:
a source-side opening, communicating with the source-side through hole and exposing a portion of the electron supply layer as a source contact in contact with the source electrode; and
a drain-side opening, communicating with the drain-side through hole and exposing a portion of the electron supply layer as a drain contact in contact with the drain electrode.

16. The nitride semiconductor device of claim 8, wherein at least one of the first protective layer and the second protective layer contains acceptor-type impurities.

* * * * *